(12) United States Patent
Liao et al.

(10) Patent No.: US 12,362,298 B2
(45) Date of Patent: Jul. 15, 2025

(54) SEMICONDUCTOR DEVICE AND METHOD OF MANUFACTURE

(71) Applicant: Taiwan Semiconductor Manufacturing Company, Hsinchu (TW)

(72) Inventors: Wei-Chun Liao, New Taipei (TW); Guo-Zhou Huang, Kaohsiung (TW); Huan-Kuan Su, Chiayi (TW); Yu-Hong Pan, Tainan (TW); Wen Han Hung, Tainan (TW); Ling-Sung Wang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 501 days.

(21) Appl. No.: 17/863,491

(22) Filed: Jul. 13, 2022

(65) Prior Publication Data

US 2024/0021548 A1    Jan. 18, 2024

(51) Int. Cl.
*H01L 23/00* (2006.01)

(52) U.S. Cl.
CPC .............. *H01L 24/04* (2013.01); *H01L 24/05* (2013.01); *H01L 24/13* (2013.01);
(Continued)

(58) Field of Classification Search
CPC .......................... H01L 2224/023–02319; H01L 2224/0233–024; H01L 2224/13024; H01L 2924/35–35121; H01L 21/02019; H01L 21/30604–30621; H01L 21/3063–30635; H01L 21/3065–30655; H01L 21/31055–31056; H01L 21/31111–31122; H01L 21/31133–31138; H01L 21/32133–32139; H01L 21/465; H01L 23/535; H01L 23/5221; H01L 21/74;
(Continued)

(56) References Cited

U.S. PATENT DOCUMENTS

2014/0183693 A1* 7/2014 Tsai .................. H01L 24/13
257/532

FOREIGN PATENT DOCUMENTS

DE    102006037717 A1 * 2/2007 .......... H01L 23/3114

* cited by examiner

*Primary Examiner* — Julio J Maldonado
*Assistant Examiner* — Eric Manuel Mulero Flores
(74) *Attorney, Agent, or Firm* — Lippes Mathias LLP

(57) ABSTRACT

A semiconductor device and method of manufacturing that includes a first etch stop layer and a second etch stop layer to prevent delamination and damage to underlying components. A first passivation layer and a second passivation layer are disposed on a substrate, with a metal pad exposed through the passivation layers and contacting a top metal component of the substrate. The first etch stop layer is then formed on the second passivation layer and the metal pad. A third passivation layer is then formed on the substrate with an opening to the metal pad, which is covered by the first etch stop layer. The second etch stop layer is then formed on the third passivation layer and in the opening on the second etch stop layer. A bottom metal film/conductive component is then formed on the second etch stop layer, photoresist is applied, and wet etching is performed. The metal pad is protected from damage caused by delamination of the second etch stop layer by the first etch stop layer.

20 Claims, 19 Drawing Sheets

(52) U.S. Cl.
CPC .............. *H01L 2224/02311* (2013.01); *H01L 2224/02331* (2013.01); *H01L 2224/024* (2013.01); *H01L 2224/0401* (2013.01); *H01L 2224/05008* (2013.01); *H01L 2224/13024* (2013.01); *H01L 2924/01022* (2013.01); *H01L 2924/01073* (2013.01); *H01L 2924/05042* (2013.01); *H01L 2924/0535* (2013.01); *H01L 2924/07025* (2013.01); *H01L 2924/35121* (2013.01)

(58) Field of Classification Search
CPC ............. H01L 24/27; H01L 2924/3025; H01L 23/552–556; H01L 23/5222–5225; H01L 21/76838–76895; H01L 2224/1301–13028
See application file for complete search history.

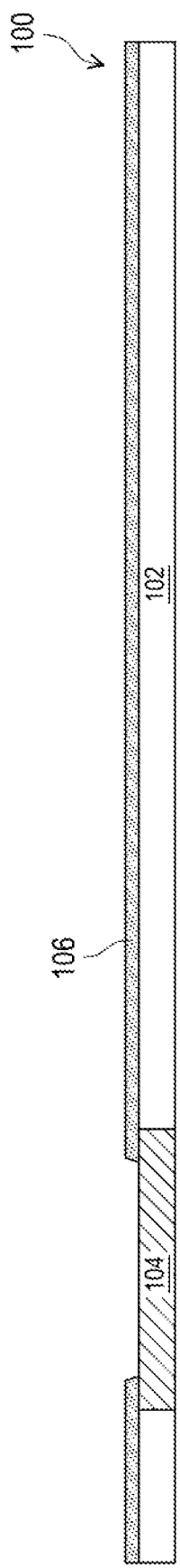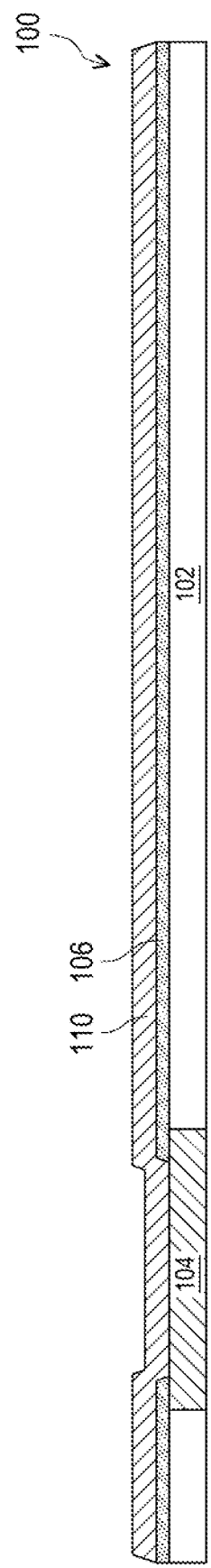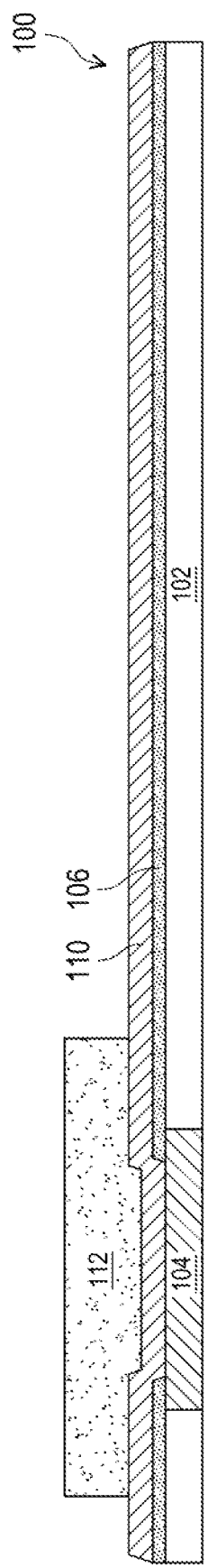

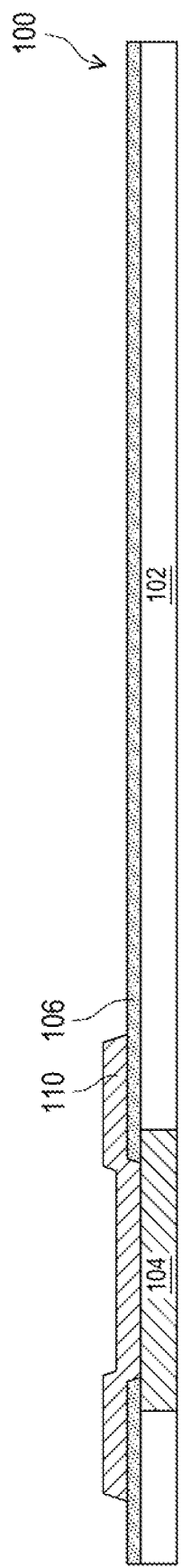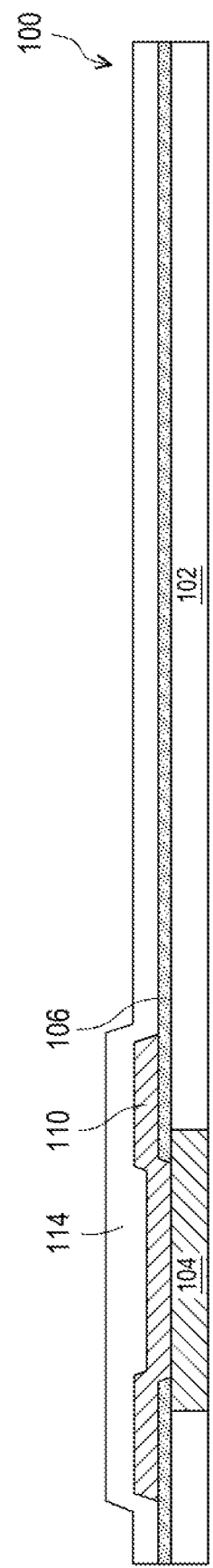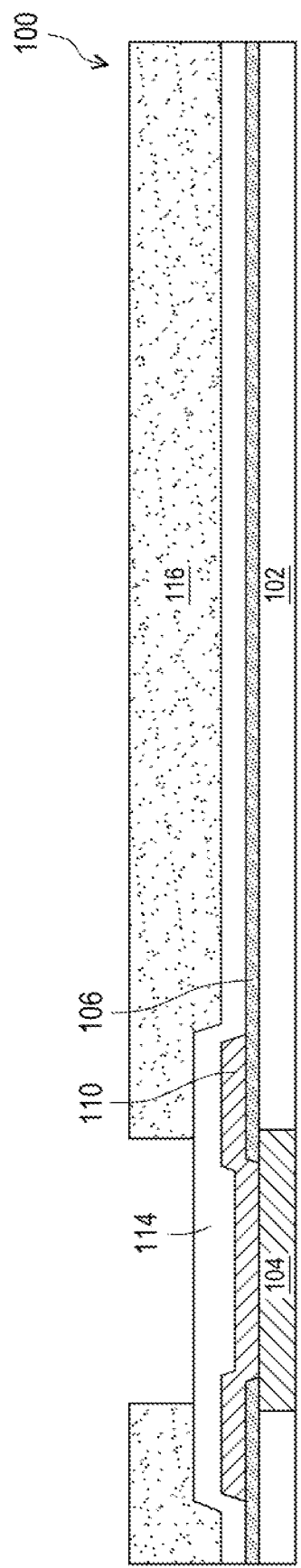

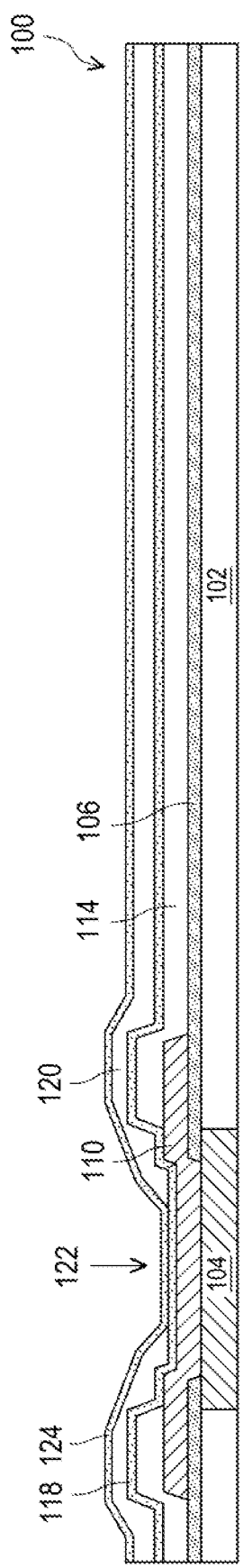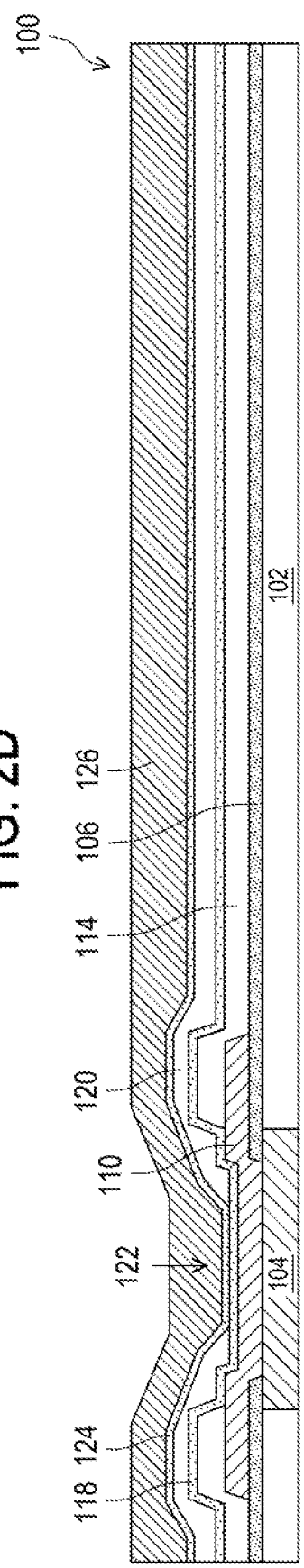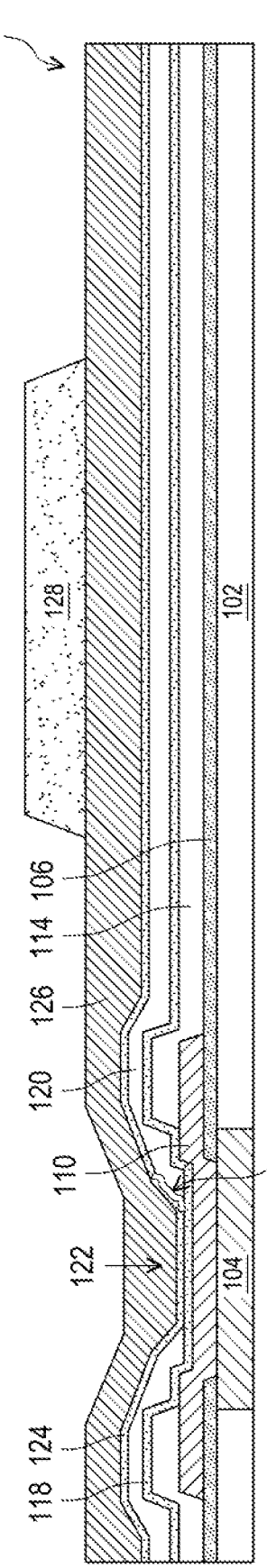

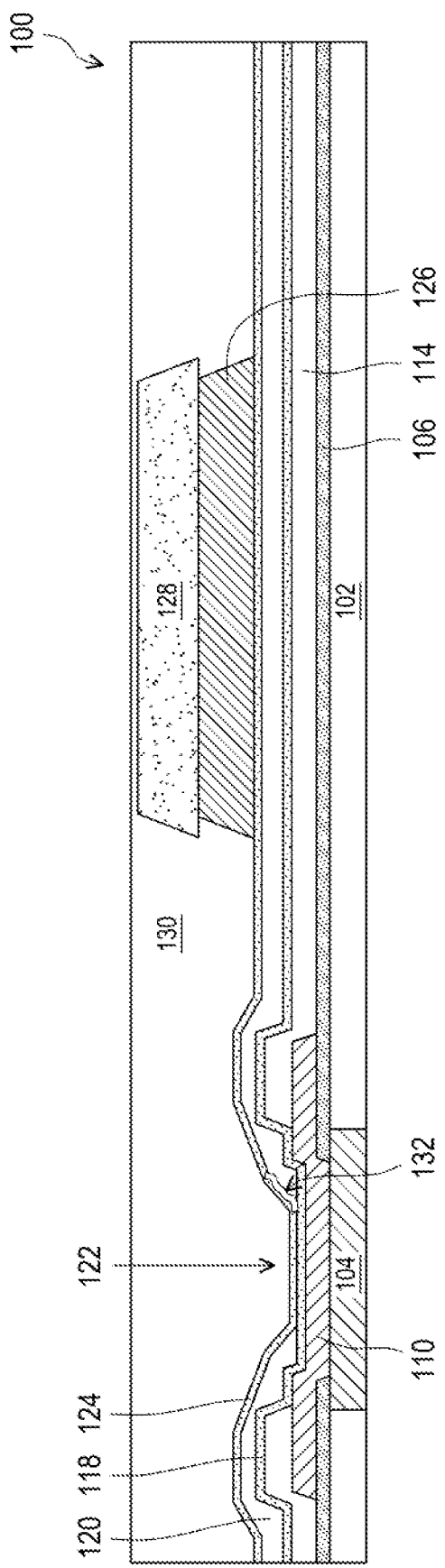
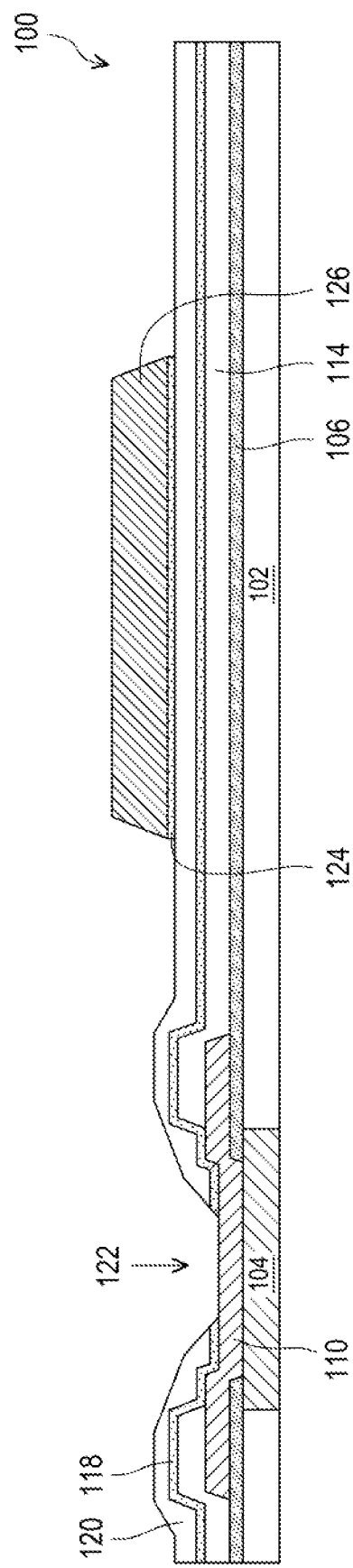
FIG. 2G
FIG. 2H

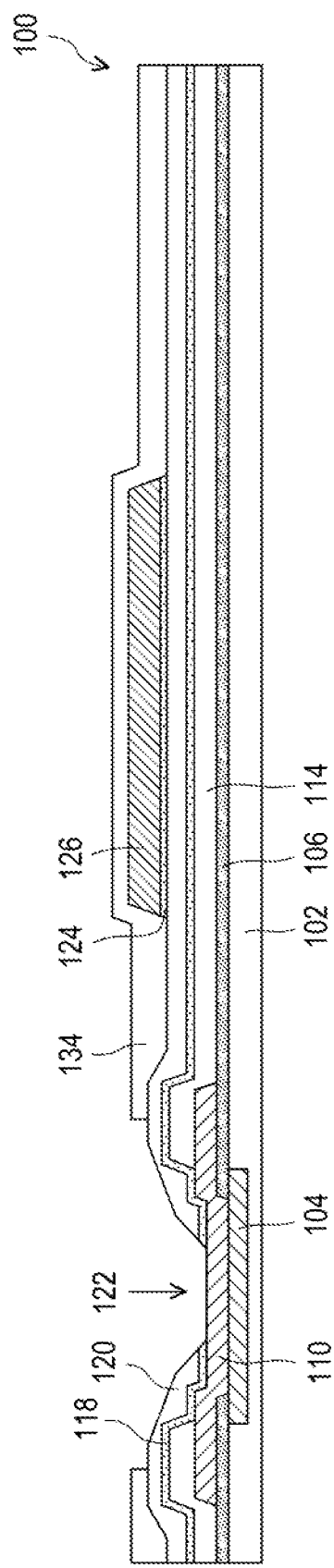
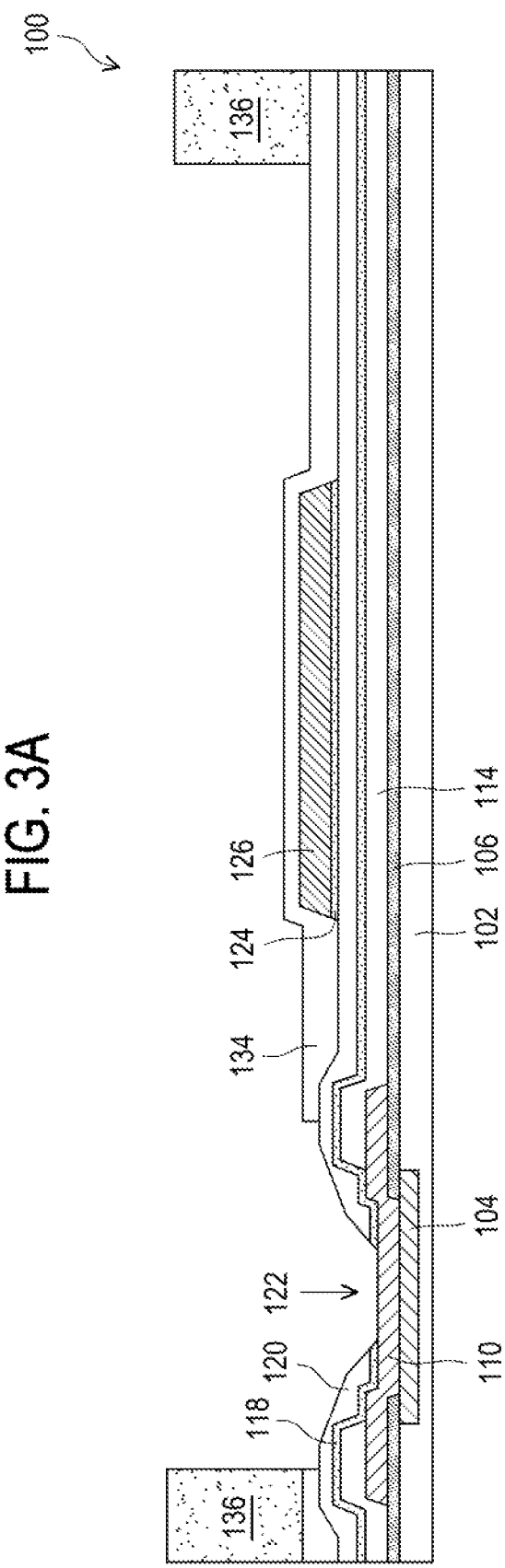
FIG. 3A
FIG. 3B

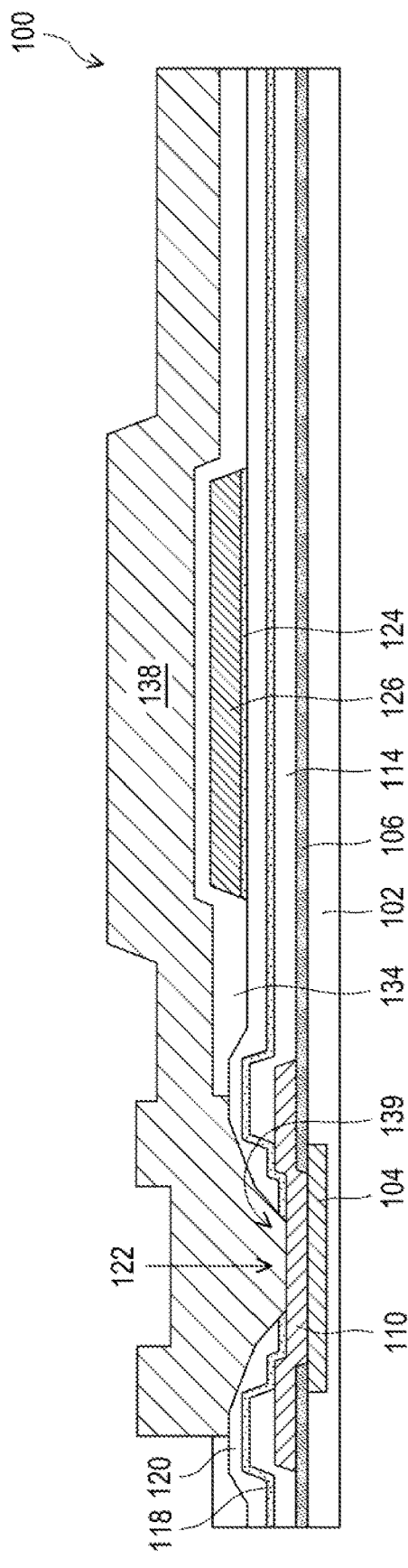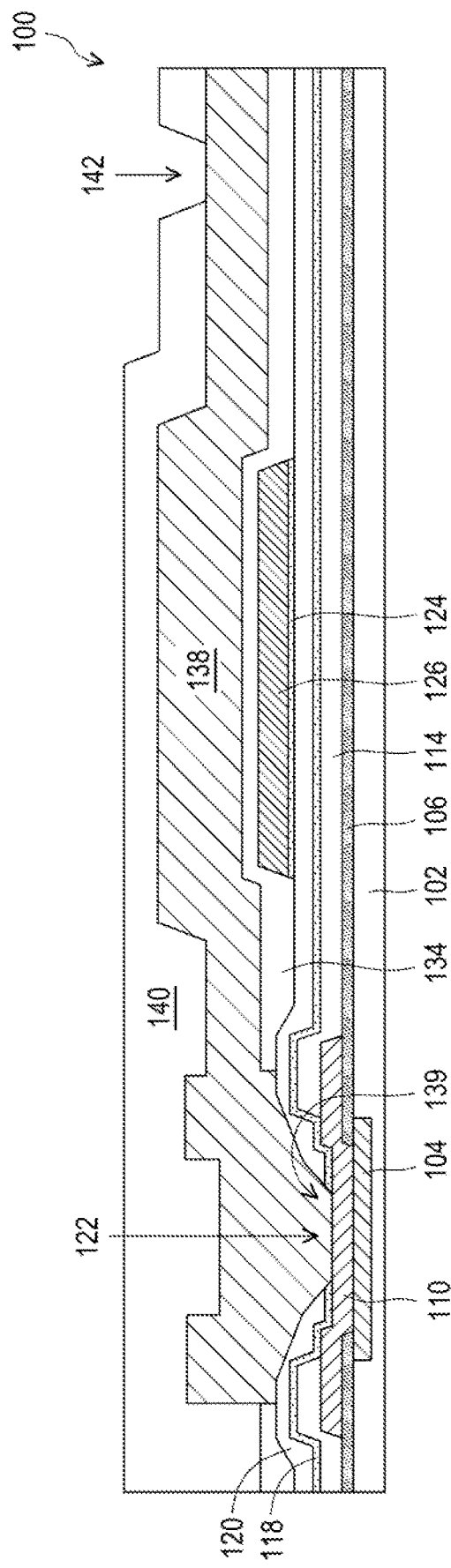

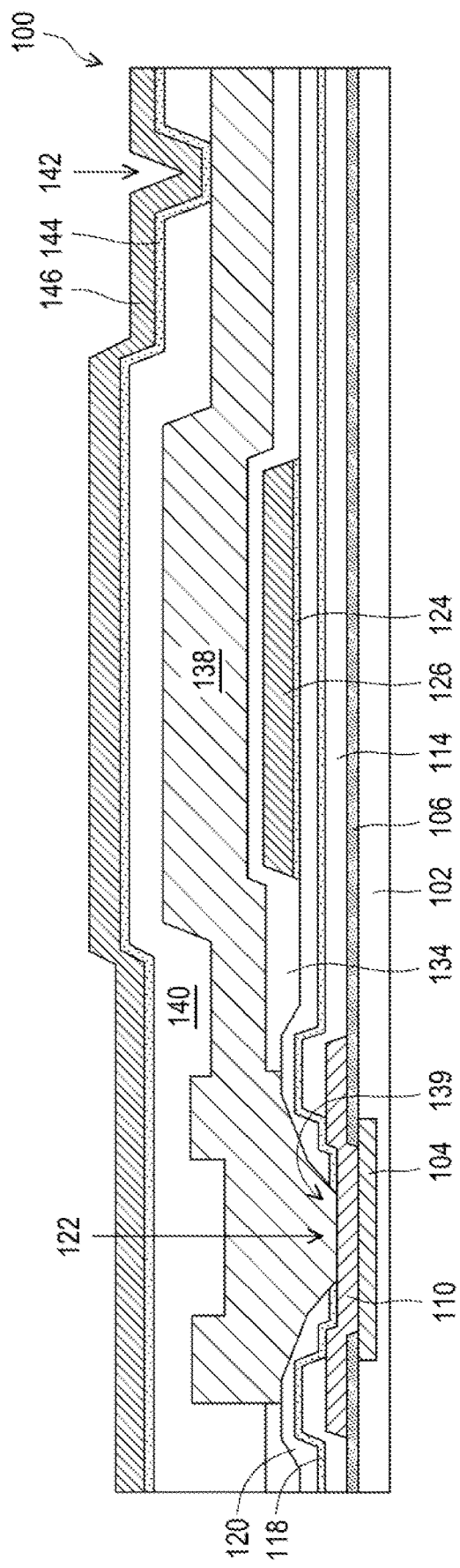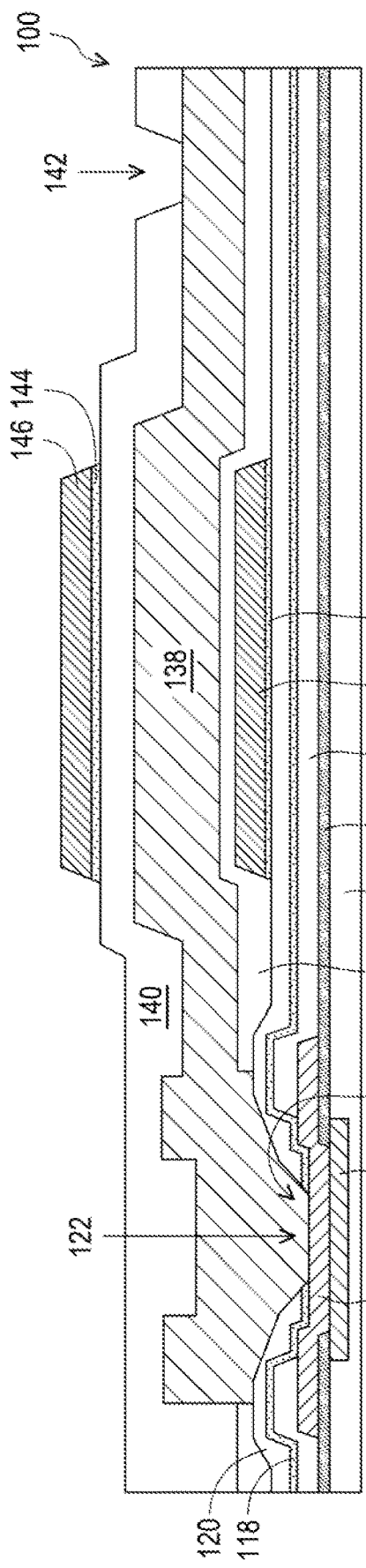

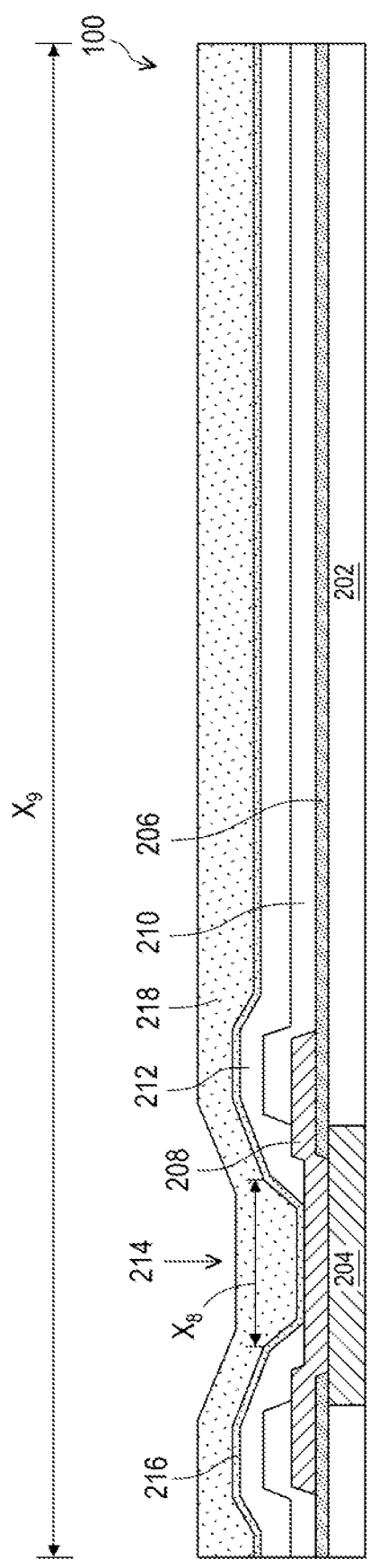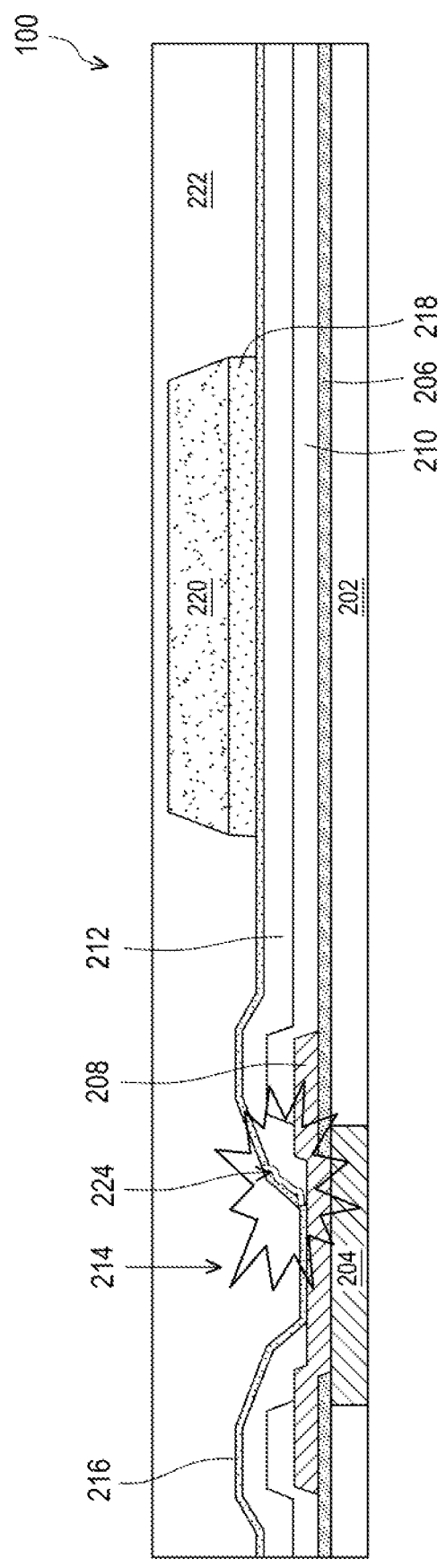

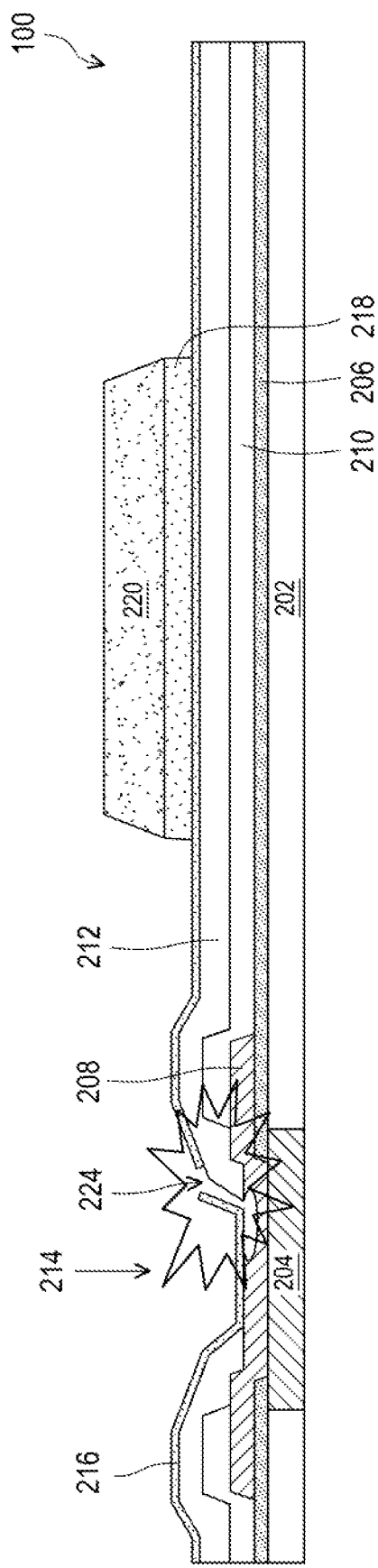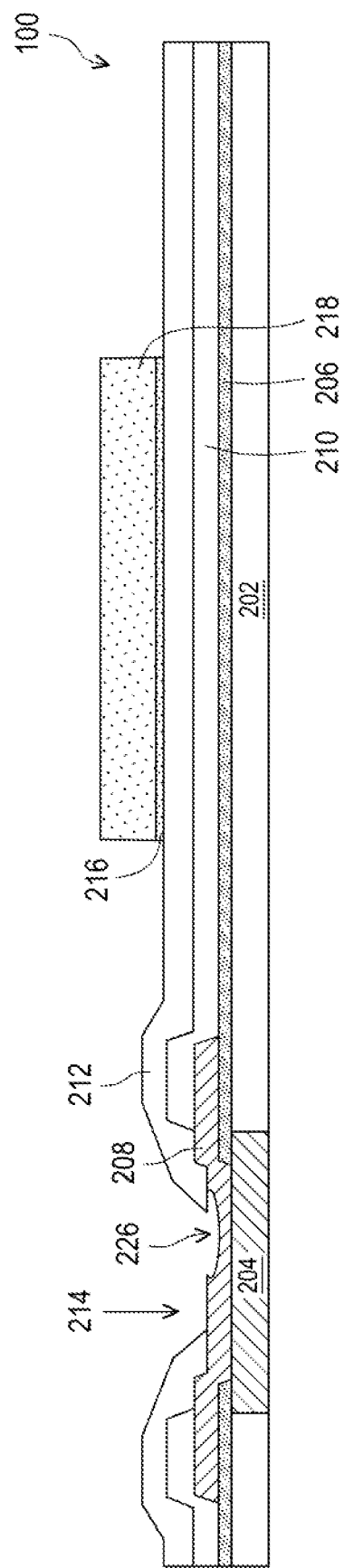

SEMICONDUCTOR DEVICE AND METHOD OF MANUFACTURE

BACKGROUND

The production of semiconductor devices includes a large number of manufacturing steps, with each step involving the application of a variety of different materials. These materials are typically deposited and patterned in layers, each layer stacking upon the preceding layer. One of the processes for forming the layers of the semiconductor device includes etching. To protect the layers below the layer being etched, an etch stop layer is first formed. This etch stop layer functions a non-reactive barrier between the underlying layer and the etching solution.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1I illustrate cross-sectional views of some steps for forming a semiconductor device in accordance with some embodiments.

FIGS. 2A-2I illustrate cross-sectional views of additional steps for forming a semiconductor device in accordance with some embodiments.

FIGS. 3A-3J illustrate cross-sectional views of additional steps for forming a semiconductor device in accordance with some embodiments.

FIGS. 5A-5G illustrate cross-sectional views of some steps for forming a semiconductor device in accordance with a comparative embodiment.

DETAILED DESCRIPTION

Figure 1A:
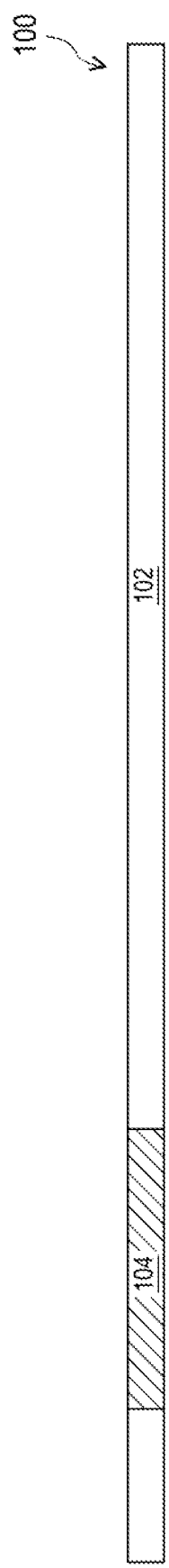

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

A semiconductor device generally consists of a stack of many different materials, such as dielectric materials, metallization materials, etch stop materials, barrier layer materials, and other materials utilized in the formation of the semiconductor device. Each one of these different materials may have a unique coefficient of thermal expansion that is different from the other materials. This type of coefficient of thermal expansion mismatch causes each one of the materials to expand a different distance when the semiconductor device is heated during later processing, testing or use. As such, at elevated temperatures there is a coefficient of thermal expansion mismatch that causes stresses to form between the different materials and, hence, the different parts of the semiconductor device. If not controlled, these stresses can cause delamination to occur between the various layers of material, especially when the materials used include copper and a low-k dielectric layer. This delamination can damage or even destroy the semiconductor device during the manufacturing process or else during its intended use.

Delamination in etch stop layers is particularly problematic in semiconductor device manufacturing, as the layer below the delaminated etch stop layer may be sufficiently damaged to render the semiconductor device unusable. For example, an etch stop layer positioned between two different conductive layers may be subjected to localized stress during manufacturing, e.g., an aluminum pad and a subsequently deposited metal film/conductive layer. In addition to thermal expansion mismatch, adhesion of the etch stop layer may be different depending upon which materials are used in preceding and succeeding layers. This delamination of the etch stop layer may occur along sidewalls of an opening or bump opening through a polyimide layer. When wet etching is performed on the metal film/conductive layer, the wet etching product, such as an acid, may infiltrate through the delaminated etch stop barrier, causing damage to the underlying aluminum pad.

Turning now to FIGS. 1A-3I, there is shown an illustrative process of forming a semiconductor device 100 for further processing to utilize a plurality of etch stop layers in accordance with one embodiment of the subject application. That is, FIGS. 1A-3J show cross-sectional views of various stages of a method of manufacturing a semiconductor device 100 in accordance with one embodiment. In the following, various layers or films are deposited and patterned. The patterning of a layer may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist. In other embodiments, patterning of an electron-sensitive resist layer may be by way of electron beam exposure (electron beam lithography, i.e., e-beam lithography). The skilled artisan will appreciate that the foregoing are merely illustrative examples.

Turning now to FIG. 1A, an integrated circuit substrate 102 is depicted having at least one top metal component 104 disposed thereon. It will be appreciated that the illustration in FIG. 1A corresponds to the integrated circuit substrate 102 upon which the top metal component 104 has been previously deposited and patterned, followed by chemical-mechanical polishing (CMP), resulting in the planar surface shown in FIG. 1A. In accordance with one embodiment, the integrated circuit substrate 102 may be implemented using a suitable semiconductor substrate including, for example and without limitation, silicon, extreme low-k (dielectric) (ELK) material, undoped silicon glass (USG) material, silicon dioxide ($SiO_2$) material, silicon nitride ($SiN_x$) material, a complimentary metal-oxide semiconductor ("CMOS") material, or the like.

As shown in FIG. 1A, the integrated circuit substrate 102 utilizes one or more electrically conductive components, e.g., the top metal component 104 disposed therein. In accordance with one embodiment, the top metal component 104 may be implemented as electrical circuit components or contacts of a CMOS circuit. In some embodiments, the top metal component 104 corresponds to integrated circuit ("IC") components that are disposed on or over the substrate 102. Suitable examples of such IC components may include, for example and without limitation, active components (e.g., transistors), passive components (e.g., capacitors, inductors, resistors, and the like), or combinations thereof. In other embodiments, the top metal component 104 may be implemented as a MOS device, e.g., a gate electrode In accordance with some embodiments, the top metal component 104 may comprise, for example, a suitable conductive metal including, for example and without limitation, copper, aluminum, iron, alloys thereof, etc. The top metal component 104 may be deposited by, for example, chemical vapor deposition (CVD), physical vapor deposition (PVD), atomic layer deposition (ALD), electroless plating, electrochemical plating, sputtering, ion metal plasma, another deposition process, or any suitable combination thereof.

Figure 1B:
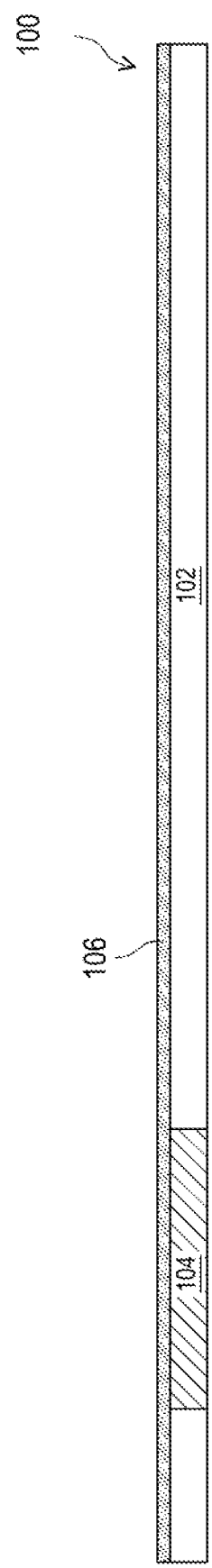
Figure 1C:
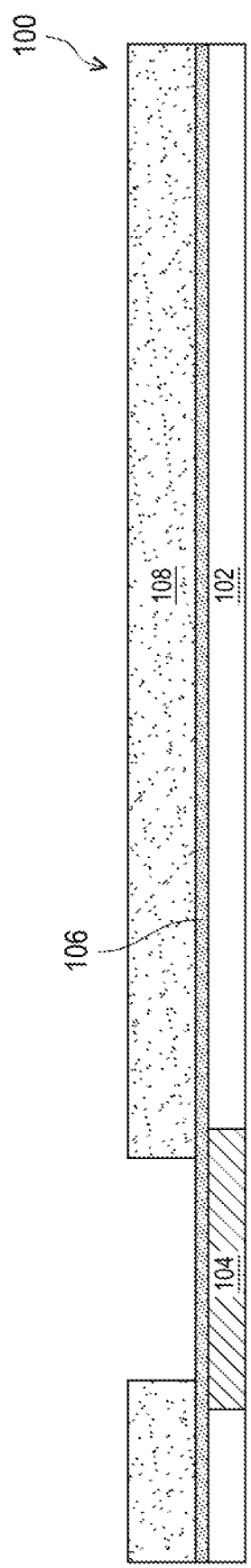

FIG. 1B illustrates the semiconductor device 100 subsequent to the formation of a first passivation layer (PASS1) 106 formed over the top metal component 104 and the substrate 102. In some embodiments, the first passivation layer (PASS1) 106 may be implemented as a suitable dielectric, i.e., insulative, material including, for example and without limitation, silicon dioxide ($SiO_2$) material, silicon nitride ($SiN_x$) material, or the like. A photoresist 108 is then deposited and patterned onto the semiconductor device 100 partially covering the first passivation (PASS1) 106 layer, as shown in FIG. 1C. As shown in FIG. 1C, deposition and patterning of the photoresist 108 is positioned above the top metal component 104, leaving a portion of the first passivation layer 106 exposed, i.e., uncovered by the photoresist 108, leaving exposed portion accessible for subsequent removal. Thereafter, the exposed portion of the first passivation layer (PASS1) 106 over the top metal component 104 is removed via any suitable process, while the portions of the first passivation layer (PASS1) 106 remains after removal via protection thereof by the photoresist 108. Suitable removal processes include, for example and without limitation, an etching process implemented as a dry etching process, a RIE process, a wet etching process, some other etching process, or a combination of the foregoing.

FIG. 1D illustrates the semiconductor device 100 after etching to remove the portion of the first passivation layer (PASS1) 106 over part of the top metal component 104, and removal of the photoresist 108. In accordance with some embodiments, removal of the unprotected portion of the first passivation layer (PASS1) 106 may be performed via an etching process implemented as a dry etching process, a RIE process, a wet etching process, some other etching process, or a combination of the foregoing. Turning now to FIG. 1E, there is shown the semiconductor device 100 after deposition of a metal pad 110 on the first passivation layer (PASS1) 106 and top metal component 104. In accordance with one embodiment, the metal pad 110 may comprise any suitable conductive material including, for example and without limitation, Al, Fe, Cu, Al—Cu, alloys thereof, or any other suitable material, as will be appreciated by the skilled artisan. In some embodiments, the composition of the top metal component 104 and the metal pad 110 may each be distinct materials, in accordance with the requirements of the semiconductor device 100. For example, in one embodiment, the top metal component 104 may be implemented as a copper (Cu) metal or metal alloy and the metal pad 110 may be implemented as an aluminum (Al) metal or metal alloy. After deposition of the metal pad 110, a photoresist 112 is formed/patterned on the semiconductor device 100 to enable removal of portions of the metal pad 110 from the semiconductor device 100, as shown in FIG. 1F. Thereafter, the metal pad 110 uncovered by the photoresist 112 is removed via etching, including, for example and without limitation, a dry etching process, a RIE process, a wet etching process, some other etching process, or a combination of the foregoing. The photoresist 112 is then removed after etching, as shown in FIG. 1G, depicting the exposed metal pad 110.

Turning now to FIG. 1H, there is shown the semiconductor device 100 subsequent to the formation of a second passivation layer (PASS2) 114 formed over the metal pad 110 and the first passivation layer (PASS1) 106. In some embodiments, the second passivation layer (PASS2) 114 may be implemented as a suitable dielectric, i.e., insulative, material including, for example and without limitation, silicon dioxide ($SiO_2$) material, silicon nitride ($SiN_x$) material, or the like. A photoresist 116 is then deposited and patterned onto the semiconductor device 100 partially covering the second passivation layer (PASS2) 114, as shown in FIG. 1I.

As illustrated in FIG. 1I, deposition and patterning of the photoresist 116 is positioned above the metal pad 110, leaving a portion of the second passivation layer (PASS2) 114 exposed, i.e., uncovered by the photoresist 116. That is, a portion of the second passivation layer (PASS2) 114 is unprotected by the photoresist 116, which may be accessible for subsequent removal. Thereafter, the exposed portion of the second passivation layer (PASS2) 114 over the metal pad 110 is removed via any suitable process, while the portions of the second passivation layer (PASS2) 114 remains after removal via protection thereof by the photoresist 116. Suitable removal processes include, for example and without limitation, an etching process implemented as a dry etching process, a RIE process, a wet etching process, some other etching process, or a combination of the foregoing.

Figure 2A:
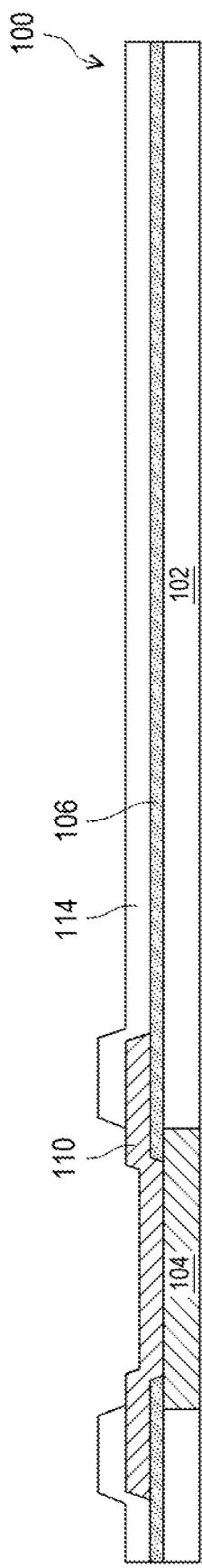
Figure 2B:
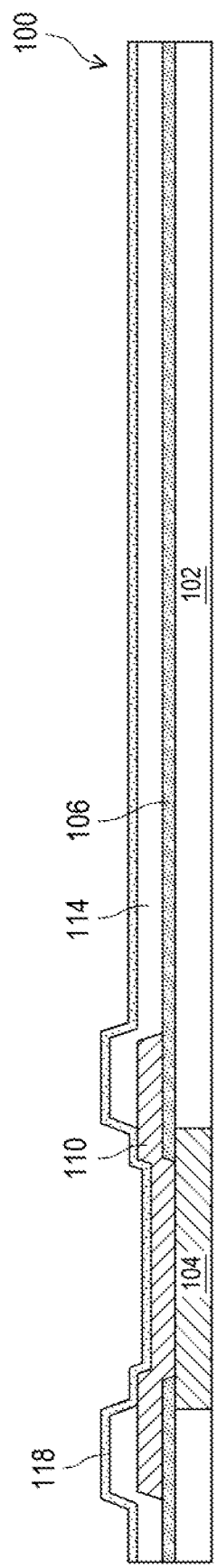

Turning now to FIGS. 2A-2I, there are shown the next steps for forming the semiconductor device 100 in accordance with varying embodiments of the subject application. FIGS. 2A-2I continue from the processing set forth above in FIGS. 1A-1I, and begin with FIG. 2A. As shown in FIG. 2A, the second passivation layer (PASS2) 114 and photoresist 116 have been removed, exposing a portion of the metal pad 110 accessible through the second passivation layer (PASS2) 114. In FIG. 2B, a first etch stop layer (ESL1) 118 is deposited on the semiconductor device 100. As shown in FIG. 2B, the first etch stop layer (ESL1) 118 comprises a suitable barrier material configured to protect the layers and components below from damage during subsequent etching processes. The first etch stop layer (ESL1) 118 may be implemented as tantalum oxide (TaO), tantalum (Ta), titanium (Ti), silicon nitride (SiN), and the like. It will be appreciated that the first etch stop layer (ESL1) 118 corresponds to a layer of material that has drastically different etching characteristics than the material to be etched, so as to stop or halt the etching processing of the layer deposited on the etch stop layer.

Figure 2C:
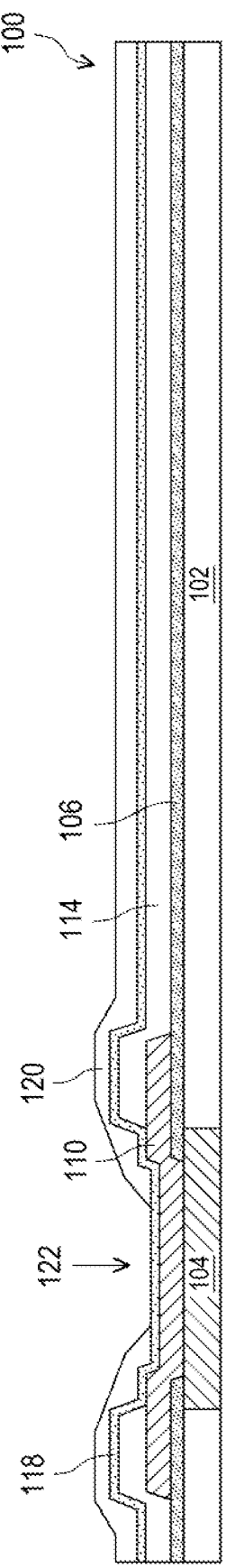

Operations progress to FIG. 2C, whereupon a third passivation layer (PI) 120 is formed on the first etch stop layer (ESL1) 118. In some embodiments, the third passivation layer (PI) 120 comprises a polyimide material, or other suitable material having equivalent thermal stability, chemical resistance, and electrical properties. It will be appreciated that the stage of formation of the semiconductor device 100 illustrated in FIG. 2C depicts the results of the coating, patterning, developing, and curing of the third passivation layer (PI) 120. As shown in FIG. 2C, an opening or trench 122 in the third passivation layer (PI) 120 remains after the aforementioned processing, leaving the first etch stop layer (ESL1) 118 exposed on the metal pad 110.

FIG. 2D illustrates the semiconductor device 100 subsequent to the deposition of a second etch stop layer (ESL2) 124. As shown in FIG. 2D, the second etch stop layer (ESL2) 124 is deposited on the third passivation layer (PI) 120 and the exposed portion of the first etch stop layer (ESL1) 118 within the opening 122 of the third passivation layer (PI) 120. In accordance with some embodiments, the second etch stop layer (ESL2) 124 may be implemented may be implemented as tantalum oxide (TaO), tantalum (Ta), titanium (Ti), silicon nitride (SiN), and the like. It will be appreciated that the second etch stop layer (ESL2) 124 corresponds to a layer of material that has drastically different etching characteristics than the material to be etched, so as to stop or halt the etching processing of the layer deposited on the etch stop layer. In varying embodiments, the first etch stop layer (ESL1) 118 and the second etch stop layer (ESL2) 124 may be implemented as the same type of material, or may be different materials.

Turning now to FIG. 2E, there is shown the deposition of a bottom metal film/conductive layer 126 on the semiconductor device 100 in accordance with one embodiment of the subject application. The bottom metal film/conductive layer 126 is formed on the second etch stop layer (ESL2) 124 of a suitable metal material. In some embodiments, the bottom metal film/conductive layer 126 is formed of iron, cobalt, titanium-nitride (TiN), nickel, copper, or the like. A photoresist 128 is then applied to the bottom metal film/conductive layer 126, as shown in FIG. 2F. It will be appreciated that delamination may occur of the second etch stop layer (ESL2) 124 as a result of a variety of factors, e.g.,
the polyimide (third) passivation layer (PI) 120 thickness uniformity (the edges of the PI may be thicker than other portions of the third passivation layer (PI) 120). When uniform thickness is not achieved, the polyimide is thicker on the sides of the opening 122. This thicker polyimide results in steeper slopes on the sides of the opening 122, which negatively impacts the etch stop coverage, i.e., the sharper the sides of the opening 122 of the third passivation layer (PI) 120 narrows the etch stop coverage window. Further, the disparate types of metal of the bottom metal film/conductive layer 126 and the metal pad 110 may induce stress, e.g., an unbalanced metal connection, in essence pulling the second etch stop layer (ESL2) 124 away from the third passivation layer (PI) 120. Accordingly, delamination (illustrated at 132) may occur in the opening 122, allowing wet etching products 130 to get underneath the second etch stop layer (ESL2) 124, as shown in FIG. 2G.

FIG. 2G illustrates application of the wet etching product 130, e.g., an acid or other corrosive/reactive liquid to remove portions of the bottom metal film/conductive layer 126 not protected by the photoresist 128. As shown in FIG. 2G, the wet etching product 130 has infiltrated the delaminated portion of the second etch stop layer (ESL2) 124. However, as a result of the various embodiments disclosed herein, the first etch stop layer (ESL1) 118 remains in position, thereby protecting the metal pad 110 from contact with the wet etching product 130. FIG. 2H illustrates the semiconductor device 100 after removal of the uncovered portions of the bottom metal film/conductive layer 126, the photoresist 128, and the exposed portions of the first etch stop layer (ESL1) 118 (within the opening on the metal pad 110) and second etch stop layer (ESL2) 124.

Figure 2I:
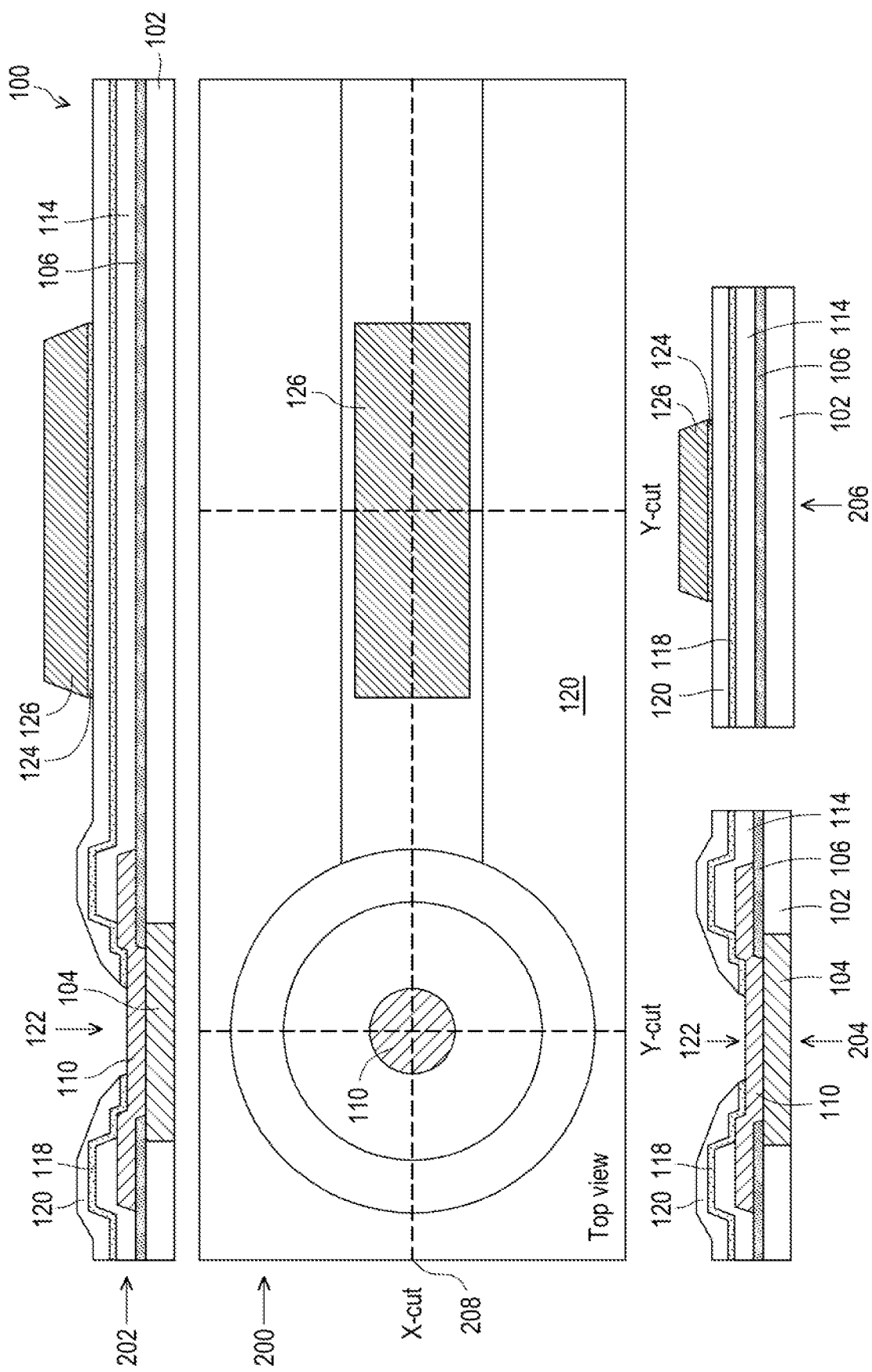

FIG. 2I provides an illustrative top view 200, side view 202 (i.e., FIG. 2H), cross-sectional view 204 of the metal pad 110, and cross-sectional view 206 of the bottom metal film/conductive layer 126 of the semiconductor device 100. As shown in FIG. 2I, the opening or trench 122 in the third passivation layer (PI) 120 is illustrated as a circular opening, enabling access to the metal pad 110 below. Further, the bottom metal film/conductive layer 126 formed on the second etch stop layer (ESL2) 124 is positioned along a centerline 208 of the semiconductor device 100, aligned with the center of the opening 122 as shown in FIG. 2I.

Figure 3G:
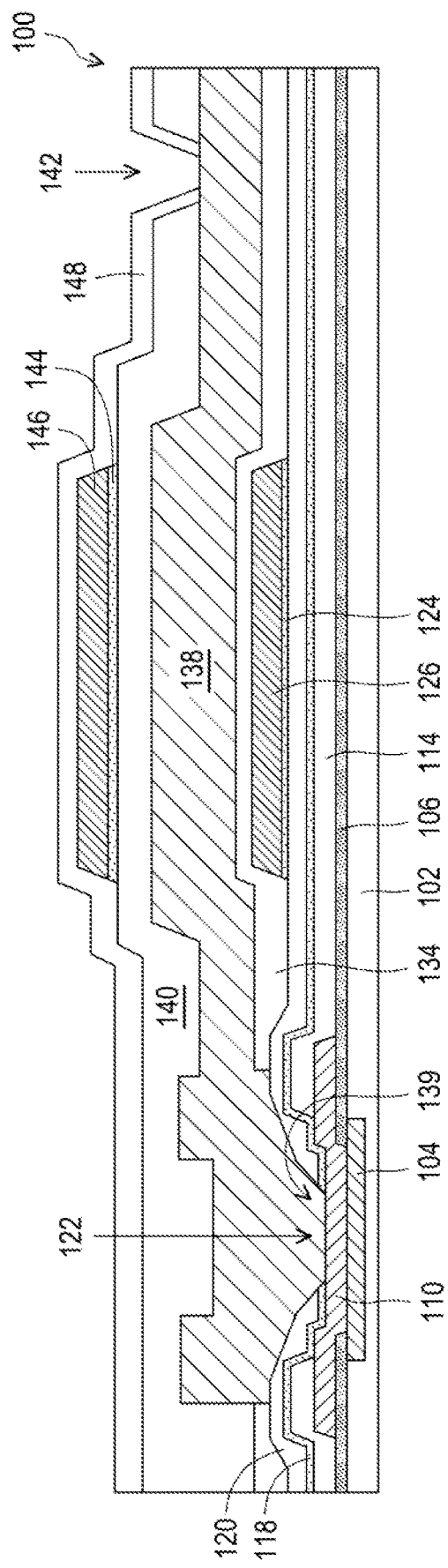

Turning now to FIGS. 3A-3J, there are shown the next steps for forming the semiconductor device 100 in accordance with varying embodiments of the subject application. FIGS. 3A-3J continue from the processing set forth above in FIGS. 1A-1I and 2A-2I, and begin with FIG. 3A. As shown in FIG. 3A, a fourth passivation layer 134 is coated, exposed, developed, etc., on the semiconductor device 100. That is, photoresist (not shown) is patterned on the semiconductor device 100 of FIG. 2H, following which the material of the fourth passivation layer 134 is deposited. The photoresist is thereafter removed, resulting in the semiconductor device 100 as illustrated in FIG. 3A. As illustrated in FIG. 3A, the opening 122 in the third passivation layer (PI) 120 exposing the metal pad 110 remains clear of insulating materials for further processing. The bottom metal film/conductive layer 126 is now encapsulated, i.e., covered, by the fourth passivation layer 134. In accordance with some embodiments, the fourth passivation layer 134 may be implemented as a suitable polyimide material, functioning as a polyimide fence (PMF), i.e., a polyimide layer between the bottom metal film/conductive layer 126 and a subsequently formed metal post passivation interconnect (PPI) 138 (as illustrated in FIG. 3C, below). Other suitable materials may be utilized for the fourth passivation layer 134, including, for example and without limitation, insulative material such as silicon dioxide (SiO$_2$), silicon nitride (SiN$_x$), and the like.

In FIG. 3B, a photoresist 136 is deposited and patterned on the fourth passivation layer 134 of the semiconductor device 100. A metal post passivation interconnect (PPI) 138 is then plated on the semiconductor device 100, and patterned as will be appreciated. The patterning of the metal post passivation interconnect (PPI) 138, or redistribution layer (RDL) may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist. FIG. 3C illustrates the semiconductor device 100 after removal of any photoresist, showing the metal post passivation interconnect (PPI) 138 exposed for subsequent processing. As depicted in FIG. 3C, the metal post passivation interconnect (PPI) 138 includes a via 139 extending through the opening 122 to contact metal pad 110.

FIG. 3D illustrates the semiconductor device 100 after deposition and patterning of a fifth passivation layer 140 in accordance with some embodiments of the subject application. As shown in FIG. 3D, the fifth passivation layer 140 has been patterned to include a bump opening or trench 142, enabling connection between a bump 152 (shown in FIG. 3J) and the metal post passivation interconnect (PPI) 138. The fifth passivation layer 140 may be implemented as a suitable polyimide material. Other suitable materials may be utilized for the fifth passivation layer 140, including, for example and without limitation, insulative material such as silicon dioxide (SiO$_2$), silicon nitride (SiN$_x$), and the like. It will be appreciated that deposition and patterning of the fifth passivation layer 140 may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist, with subsequent removal of the photoresist.

A third etch stop layer (ESL3) 144 is then deposited on the fifth passivation layer 140, followed by deposition of a top metal film/conductive layer 146. The semiconductor device 100 after the deposition of the third etch stop layer (ESL3) 144 and the top metal film/conductive layer 146 is illustrated in FIG. 3E. In accordance with some embodiments, the third etch stop layer (ESL3) 144 may comprise a suitable barrier material configured to protect the layers and components below from damage during subsequent etching processes, i.e., protect the fifth passivation layer 140 from damage when the top metal film/conductive layer 146 is etched. The third etch stop layer (ESL3) 144 may be implemented as tantalum oxide (TaO), tantalum (Ta), titanium (Ti), silicon nitride (SiN), and the like. In some embodiments, the top metal film/conductive layer 146 is formed of iron, cobalt, titanium-nitride (TiN), nickel, copper, alloys thereof, other conductive metals or metallic alloys, or the like.

The semiconductor device 100 of FIG. 3E is then subjected to application of a photoresist (not shown) on the top metal film/conductive layer 146. Thereafter, wet etching is performed to remove the portions of the top metal film/conductive layer 146 not protected by the photoresist. The photoresist and the portions of the third etch stop layer (ESL3) 144 not covered by the remaining top metal film/conductive layer 146 are then removed. FIG. 3F provides an illustrative view of the semiconductor device 100 after the aforementioned etching and removal processes are performed. As shown in FIG. 3F, the fifth passivation layer 140, having been protected from wet etching products by the third etch stop layer (ESL3) 144 is now exposed. Further, as indicated in FIG. 3F, the bump opening 142 within the fifth passivation layer 140 remains with access to the metal post passivation interconnect (PPI) 138.

A sixth passivation layer 148 is then deposited and patterned on the semiconductor device 100 in accordance with some embodiments of the subject application. As shown in FIG. 3G, the sixth passivation layer 148 covers the fifth passivation layer 140, the top metal film/conductive layer 146 and the sides of the bump opening 142, with the metal post passivation interconnect (PPI) 138 remaining accessible at the bottom of the bump opening 142. It will be appreciated that deposition and patterning of the sixth passivation layer 148 may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist. In some embodiments, a photoresist is applied to the bottom of the bump opening 142 on the exposed metal post passivation interconnect (PPI) 138 prior to deposition of the sixth passivation layer 148. Such photoresist is then removed so as to expose the aforementioned portion of the metal post passivation interconnect (PPI) 138 within the bump opening 142. According to one embodiment, the sixth passivation layer 148 may be implemented as a suitable polyimide material. Other suitable materials may be utilized for the sixth passivation layer 148, including, for example and without limitation, insulative material such as silicon dioxide (SiO$_2$), silicon nitride (SiN$_x$), and the like.

Figure 3H:
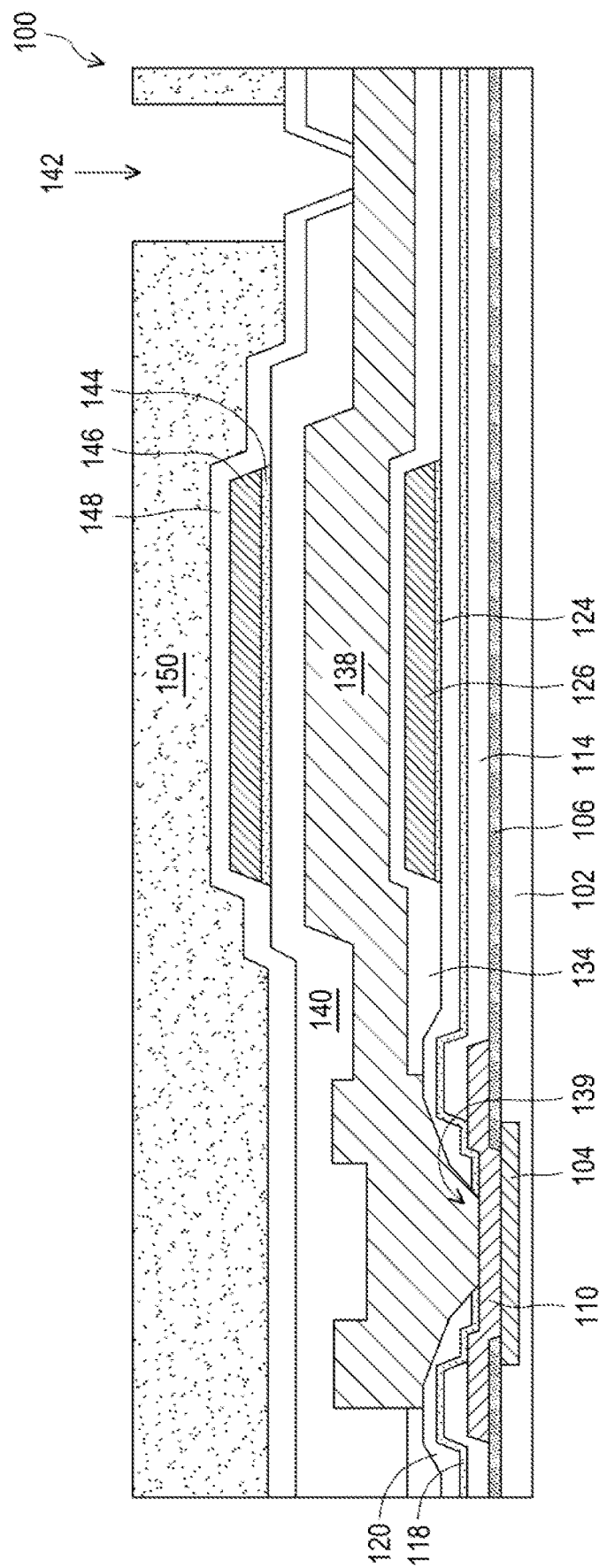

FIG. 3H illustrates a subsequent step in the formation of the semiconductor device 100 in accordance with one embodiment of the subject application. As indicated in FIG. 3H, a photoresist 150 is patterned on portions of the sixth passivation layer 148, with the bump opening 142 uncovered by the protective photoresist. Thereafter, a bump 152 is formed therein. In some embodiments, the bump 152 may comprise one or more distinct metals, shown in FIG. 3I as a top bump metal 154 and a bottom bump metal 156. In other embodiments, the top bump metal 154 and the bottom bump metal 156 may be implemented as the same type of metal. The top bump metal 154 may be implemented as, for example and without limitation, aluminum, copper, iron, alloys thereof, or any other suitable material, as will be appreciated by the skilled artisan. The bottom bump metal 156 may be implemented as, for example and without limitation, aluminum, copper, iron, alloys thereof, or any other suitable material, as will be appreciated by the skilled artisan. According to some embodiments, deposition of the bottom bump metal 156 and the top bump metal 154 may be performed via for example, chemical vapor deposition (CVD), physical vapor deposition (PVD), atomic layer deposition (ALD), electroless plating, electrochemical plating, sputtering, ion metal plasma, another deposition process, or any suitable combination thereof.

Figure 3I:
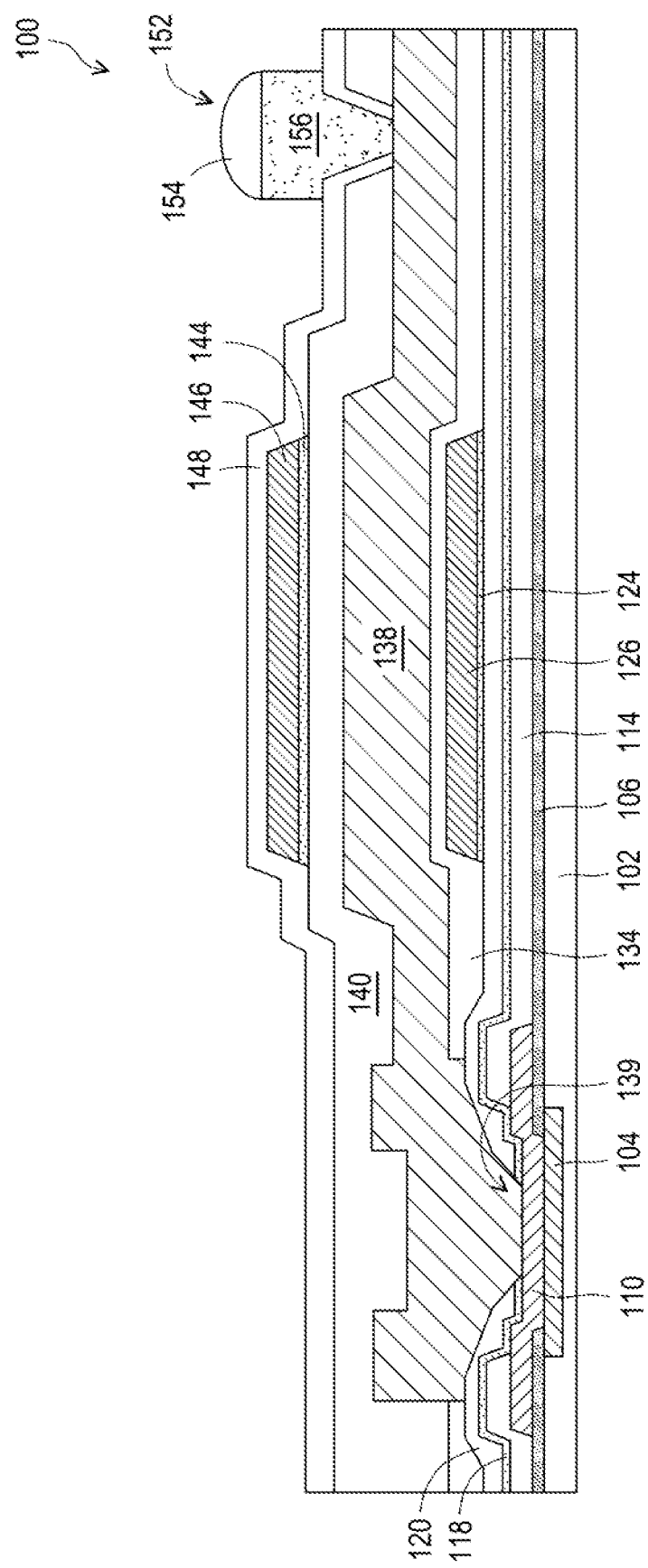
Figure 3J:
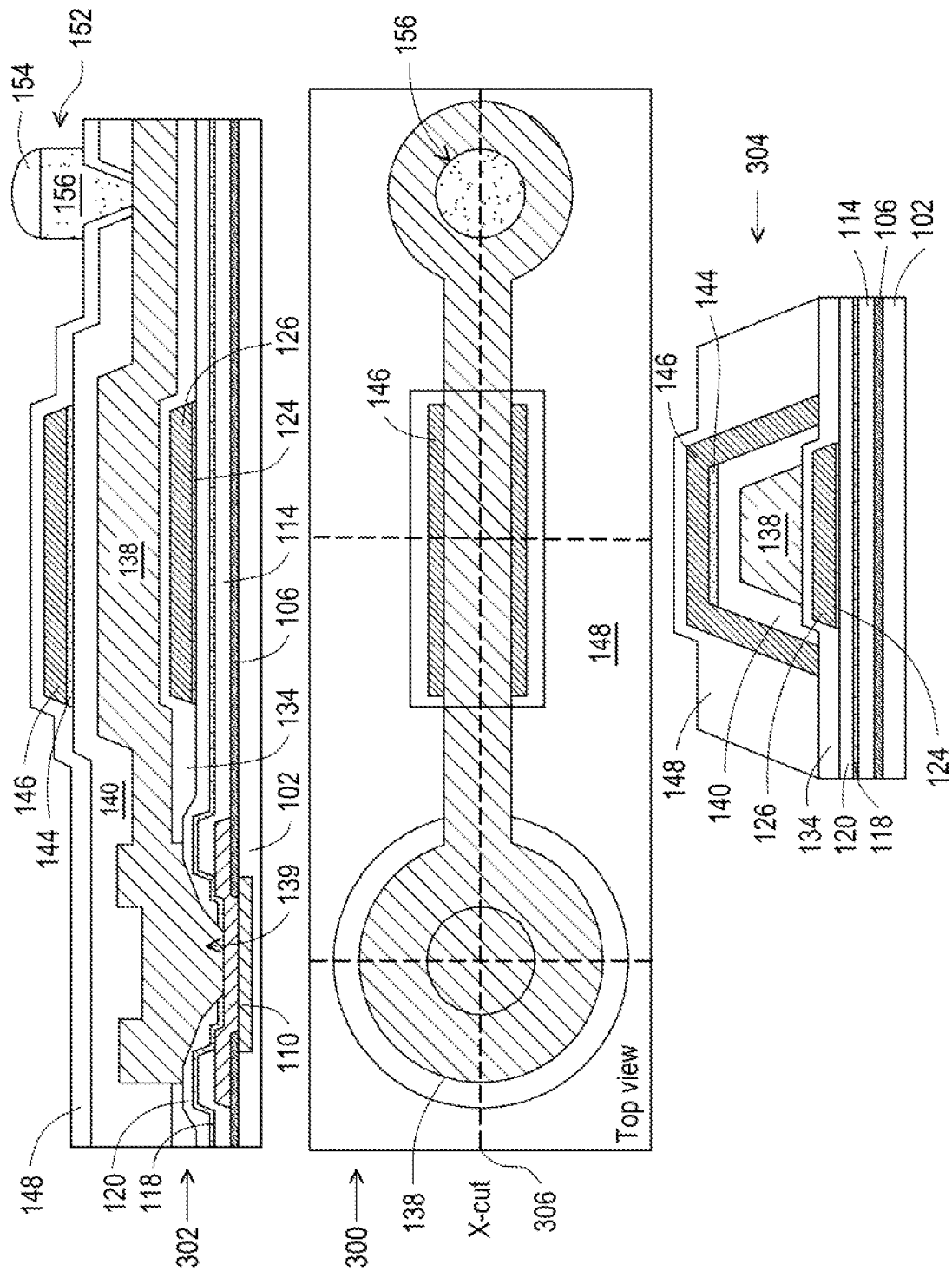

FIG. 3J provides an illustrative top view 300, side view 302 (corresponding to FIG. 3I), and a partial cross-sectional view 304 of the top metal film/conductive layer 146 of the semiconductor device 100. As shown in FIG. 3J, the metal post passivation interconnect (PPI) 138 is formed in a circular manner, filling the (circular) opening 122 in the third passivation layer (PI) 120 with via 139, and extending lengthwise along the centerline 306 to the bump opening 142. In the embodiment illustrated in FIG. 3J, the bump opening 142 is depicted filled with bottom bump metal 156 in a circular manner, with the underlying post passivation interconnect (PPI) 138 illustrated as a circular pad. As shown in the view 304, the top metal film/conductive layer 146 is formed on the third etch stop layer (ESL3) 144, straddling the post passivation interconnect (PPI) 146 along the centerline 306 of the semiconductor device 100. In the embodiment illustrated in FIG. 2I, the views 300 and 304 illustrate that the top metal film/conductive layer 146 is aligned with the center of the opening 122 and the bump opening 142.

Figure 4:
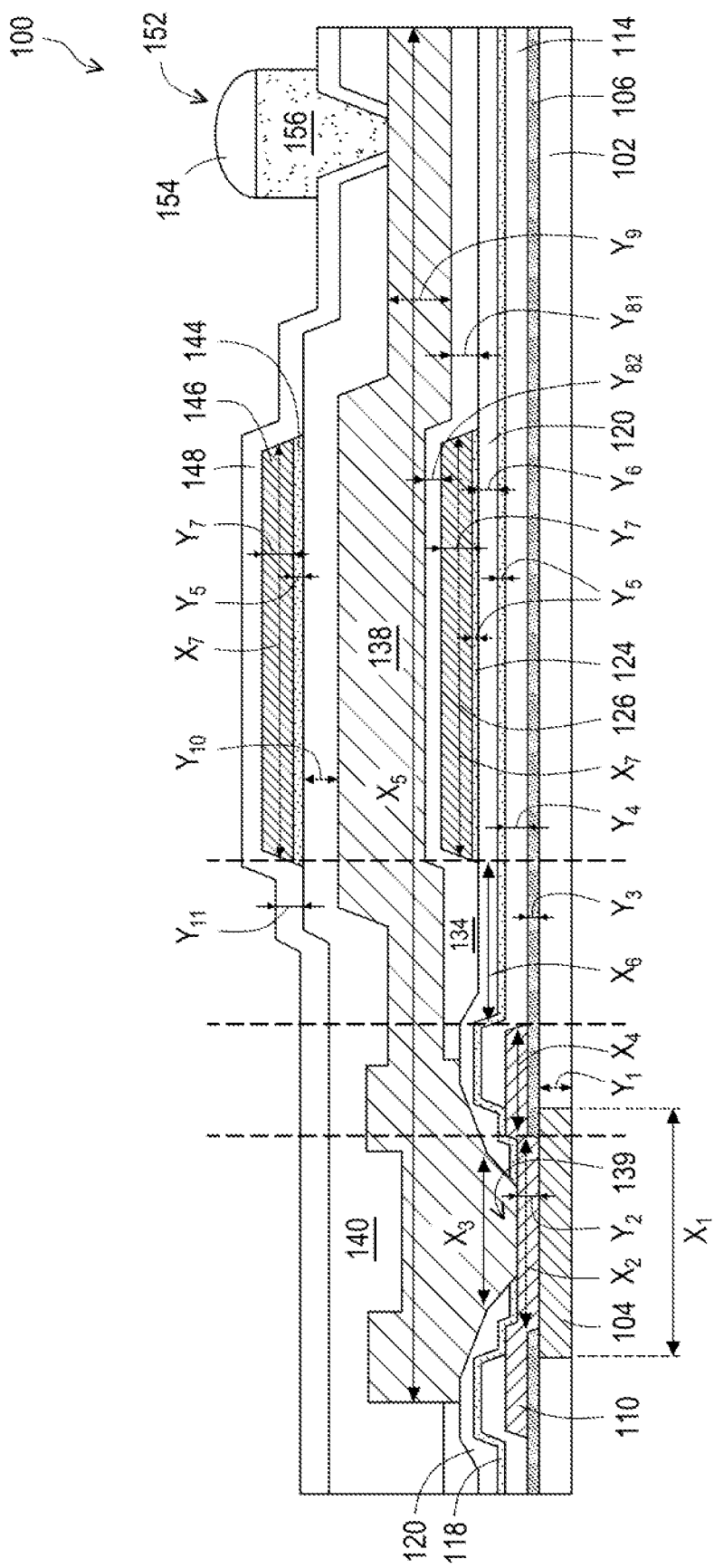
FIG. 4 illustrates a dimensionally labeled cross-sectional view of the semiconductor device in accordance with some embodiments.

Turning now to FIG. 4, there is shown an illustrative example of the semiconductor device 100 of FIGS. 3I-3J, wherein various dimensional ranges are provided. It will be appreciated that the dimensional ranges presented in FIG. 4 are exemplary in nature, and other ranges of dimensions may be utilized in accordance with the subject application.

As shown in FIG. 4, the top metal component 104 may be implemented with a width $X_1$ in the range of about 10 um~40 um, and a thickness $Y_1$ of about 1000 Å~34000 Å. The metal pad 110 may be implemented with an opening width $X_2$ in the range of about 10 um~40 um (e.g., width of the metal pad 110 contacting the top metal component 104 through the first passivation layer (PASS1) 106). In such an embodiment, the metal pad 110 may be implemented with a thickness $Y_2$ in the range of about 1000 Å~28000 Å, with a width of $X_7$ in the range of about 400 um~1500 um. The diameter $X_3$ of the opening 122 of the third passivation layer (PI) 120 may be in the range of about 10 um~40 um. Further, the portion of the metal pad 110 that extends over the first passivation layer (PASS1) 106, i.e., the metal pad 110 to top metal component 104 edge gap, may be implemented with a width $X_4$ in the range of 10 um~20 um. Further, the metal post passivation interconnect (PPI) 138 may be implemented with a length $X_5$ in the range of about 600 um~2000 um.

The semiconductor device 100 of FIG. 4 may further be implemented with a first passivation layer (PASS1) 106 thickness $Y_3$ in the range of about 6000 Å~10000 Å, and a second passivation layer (PASS2) thickness $Y_4$ in the range of about 20000 Å~25000 Å. In various embodiments, and as shown in FIG. 4, the etch stop layers (ESL1, ESL2, ESL3) 118, 124, 144 may be implemented with a thickness $Y_5$ in the range of about 1 um~10 um. The thickness $Y_6$ of the third passivation layer (PI) 120 may be implemented in the range of about 1 um~10 um. The thicknesses $Y_{81}$, $Y_{82}$ of the of the fourth passivation layer 134 may be different within the range of about 1 um~5 um, e.g., $Y_{81}$ located on the bottom metal film/conductive layer 126 may have a thickness less than $Y_{82}$ located on the third passivation layer (PI) 120. The top and bottom metal films/conductive layers 126, 146 may be implemented with a thickness $Y_7$ in the range of about 5 um~10 um. Further, the metal post passivation interconnect (PPI) 138 may be implemented with a thickness $Y_9$ in the range of about 10 um~30 um. The fifth passivation layer 140 may be implemented with a thickness $Y_{10}$ in the range of about 1 um~10 um. As illustrated in FIG. 4, the sixth passivation layer 148 may be implemented with a thickness $Y_{11}$ in the range of about 1 um~10 um.

As shown in FIGS. 4, $Y_7/Y_2 > 5$ and $Y_9/Y_2 > 5$ represents the thickness of the metal post passivation interconnect (PPI) 138 compared to the thickness of the metal pad 110. Whereas the ratio of the thickness of the metal pad 110 ($Y_2$) to the thickness of the top metal ($Y_1$) may be represented by $0.5 < Y_2/Y_1 < 3$. Further, $X_5/X_1 > 5$, $X_5/X_2 > 5$, $X_5/X_3 > 10$ represents the length of the metal post passivation interconnect (PPI) 138 relative to the opening 122 above the metal pad 110. In the embodiment of FIG. 4, $X_6/X_4$ may be implemented in the ratio range of 1~10 representing the distance between the opening 122 and the bottom metal film/conductive layer 126 in accordance with design needs of the semiconductor device 100.

Figure 5A:
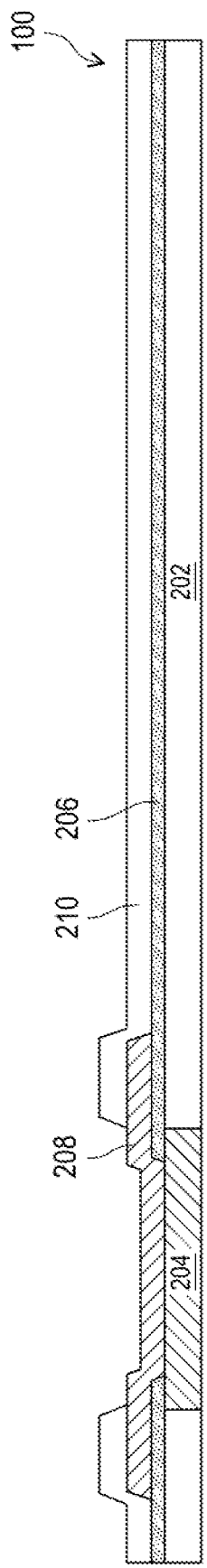

Turning now to FIGS. 5A-5G, there is shown a comparative example of utilizing a single etch stop layer in contrast to the multiple etch stop layers (ESL1, ESL2) 118, 124 used in the embodiments of FIGS. 1A-4. It will be understood that the deposition, patterning, etching, removal, i.e., the processing described above with respect to FIGS. 1A-4 are similarly applied to the semiconductor device 200 of FIGS. 5A-5G, unless otherwise noted. As shown in FIG. 5A, the semiconductor device 200 at this stage of processing includes a substrate 202, a top metal component 204, a first passivation layer (PASS1) 206, a metal pad 208, and a second passivation layer (PASS2) 210, with the metal pad 208 being accessible through the second passivation layer (PASS2) 210.

Figure 5B:
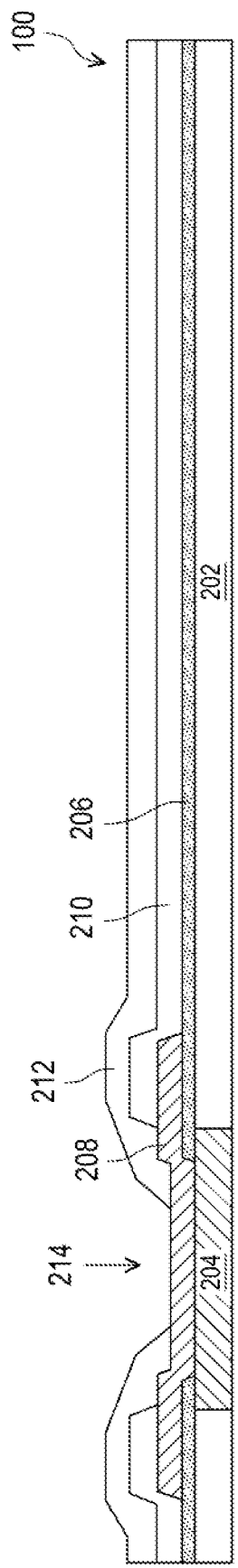

In FIG. 5B, a third passivation layer (PI) 212 has been formed on the semiconductor device 200. In some embodiments, the third passivation layer (PI) 212 comprises a polyimide material, or other suitable material having equivalent thermal stability, chemical resistance, and electrical properties. It will be appreciated that the stage of formation of the semiconductor device 200 illustrated in FIG. 5B depicts the results of the coating, patterning, developing, and curing of the third passivation layer (PI) 212. As shown in FIG. 5B, an opening 214 in the third passivation layer (PI) 212 remains after the aforementioned processing, leaving a portion of the metal pad 208 exposed therein.

Figure 5C:
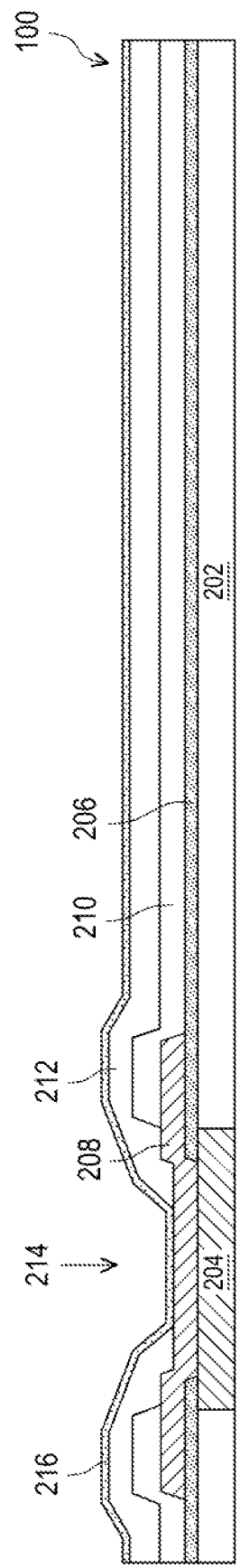

In FIG. 5C, an etch stop layer (ESL) 216 is deposited on the semiconductor device 200. As shown in FIG. 5C, the etch stop layer (ESL) 216 comprises a suitable barrier material configured to protect the layers and components below from damage during subsequent etching processes. The etch stop layer (ESL) 216 may be implemented as tantalum oxide (TaO), tantalum (Ta), titanium (Ti), silicon nitride (SiN), and the like. It will be appreciated that the etch stop layer (ESL) 216 corresponds to a layer of material that has drastically different etching characteristics than the material to be etched, so as to stop or halt the etching processing of the layer deposited on the etch stop layer.

In FIG. 5D, there is shown the deposition of a bottom metal film/conductive layer 218 on the semiconductor device 200 in accordance with one embodiment of the subject application. The bottom metal film/conductive layer 218 is formed on the etch stop layer (ESL) 216 of a suitable metal material. In some embodiments, the bottom metal film/conductive layer 218 is formed of iron, cobalt, titanium-nitride (TiN), copper, or the like. FIG. 5D illustrates two lengths, length $X_8$ corresponding to the width of the opening 214 and length $X_9$ corresponding the length of the bottom metal film/conductive layer 218. If $X_9/X_8 > 10$ (range of 10~100), then the long and thick bottom metal film/conductive layer 218, e.g., metal transmission line, will induce delamination of the etch stop layer (ESL) 216 near the opening 214 at the metal pad 208 and third passivation layer (PI) 212 due to localized stress caused by the unbalanced metal connection. That is, the disparate materials of the metal pad 208 and the top metal component 204 may stress the etch stop layer (ESL) 216 adherence to the top metal component 204 and/or the third passivation layer (PI) 212.

FIG. 5E illustrates subsequent wet etching to remove extraneous bottom metal film/conductive layer 218 portions and the resultant delamination 224 that occurs utilizing the single etch stop layer (ESL) 216 of the embodiment depicted in the comparative example of FIGS. 5A-5G. As shown in FIG. 5E, a wet etching product 222, e.g., an acid or other corrosive/reactive liquid, is applied to the semiconductor device 200 to remove portions of the bottom metal film/conductive layer 218 not protected by the photoresist 220. As illustrated in FIG. 5E, the wet etching product 222 has infiltrated a delaminated portion 224 of the etch stop layer (ESL) 216. Having bypassed the etch stop layer (ESL) 216, the wet etching product 222 has penetrated to metal pad 208 and dissolved (etched) a portion thereof. The damage 226 to the metal pad 208 is more clearly depicted in FIG. 5F. In FIG. 5F, the semiconductor device 200 is dried to remove debris and the wet etching product 222. The compromised etch stop layer (ESL) 216 is still present on the semiconductor device 200, however it is clear that a portion of the metal pad 208 has been removed by the wet etch product 222. In FIG. 5G, the etch stop layer (ESL) 216 has been removed and the damage 226 to the metal pad 208 is exposed. It will be appreciated that the application of multiple etch stop layers, such as used in FIGS. 1A-4 prevents such damage from occurring to the metal pad, as a second etch stop layer remains to prevent the wet etching product from penetrating to the metal pad when a first etch stop layer delaminates.

Figure 6:
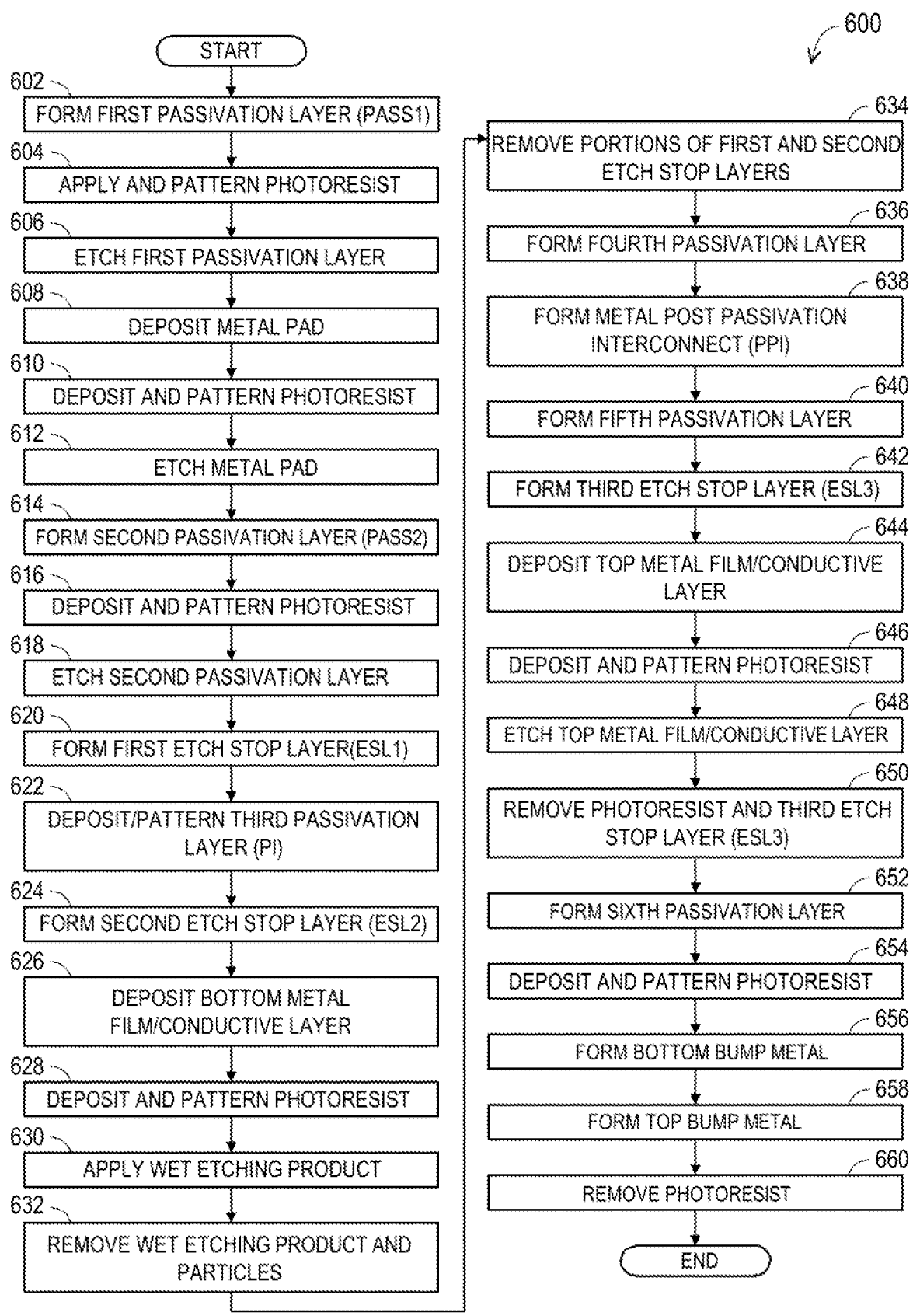
FIG. 6 illustrates a flowchart for a method for forming a semiconductor device in accordance with some embodiments.

With reference now to FIG. 6, there is shown a flowchart illustrating a method 600 for forming a semiconductor device 100 in accordance with one embodiment. The method 600 begins at step 602, whereupon a first passivation layer (PASS1) 106 is formed on a substrate 102 comprising one or more top metal components 104. In some embodiments, the first passivation layer (PASS1) 106 may be implemented as a suitable dielectric, i.e., insulative, material including, for example and without limitation, silicon dioxide (SiO$_2$) material, silicon nitride (SiN$_x$) material, or the like. The first passivation layer (PASS1) 106 may be deposited, for example and without limitation, by CVD, PVD, ALD, some other deposition process, or any suitable combination thereof.

In accordance with one embodiment, the substrate 102 may be implemented using a suitable semiconductor substrate including, for example and without limitation, silicon, extreme low-k (dielectric) (ELK) material, undoped silicon glass (USG) material, silicon dioxide (SiO$_2$) material, silicon nitride (SiN$_x$) material, a complimentary metal-oxide semiconductor ("CMOS") material, or the like. In accordance with some embodiments, the top metal component 104 may comprise, for example, a suitable conductive metal including, for example and without limitation, copper, aluminum, iron, alloys thereof, etc. In some embodiments, the top metal component 104 may be implemented as an integrated circuit component such as, for example and without limitation, active electronic devices (e.g., transistors), passive electronic devices (e.g., resistors, capacitors, inductors, fuses, etc.), some other electronic devices, or a combination thereof. Formation of the top metal component 104 may be accomplished in accordance with suitable deposition, etching, CMP, etc., processes as will be appreciated by those skilled in the art. In some embodiments, the first passivation layer (PASS1) 106 may be implemented as a suitable dielectric, i.e., insulative, material including, for example and without limitation, silicon dioxide (SiO$_2$) material, silicon nitride (SiN$_x$) material, or the like.

At step 604, a photoresist 108 is applied and patterned onto the first passivation layer (PASS1) 106 of the substrate 102. FIG. 1C provides an illustrative example of the patterned photoresist 108 the first passivation layer (PASS1) 106. As will be appreciated, the photoresist 108 leaves uncovered, i.e., unprotected, a portion of the first passivation layer (PASS1) 106 located above a portion of the top metal component 104. At step 606, etching of the first passivation layer (PASS1) 106 is performed on the semiconductor device 100, followed by removal, i.e., stripping, of the photoresist 108, as illustrated in FIG. 1D. In accordance with some embodiments, the etching may be performed in accordance with any suitable etching process, e.g., an etching process implemented as a dry etching process, a RIE process, a wet etching process, some other etching process, or a combination of the foregoing.

At step 608, a metal pad 110 is deposited on the first passivation layer (PASS1) 106 and exposed portion of the top metal component 104, as illustrated in FIG. 1E. In accordance with one embodiment, the metal pad 110 is formed of a conductive material, including, for example and without limitation, a metal (e.g., titanium, tungsten, silver, gold, aluminum, copper, or alloys thereof), metal nitride, or any suitable combination thereof. In some embodiments, the metal pad 110 may be deposited by, for example, CVD, PVD, ALD, electroless plating, electrochemical plating, sputtering, ion metal plasma, another deposition process, or any suitable combination thereof. At step 610, a photoresist 112 is deposited and patterned on the metal pad 110, as illustrated in FIG. 1F.

At step 612, the portions of the metal pad 110 unprotected (i.e., covered) by the photoresist 112, are removed via etching, resulting in the metal pad 110 disposed over and in contact with the top metal component 104, as shown in FIG. 1G. In accordance with some embodiments, the etching may be performed in accordance with any suitable etching process, e.g., an etching process implemented as a dry etching process, a RIE process, a wet etching process, some other etching process, or a combination of the foregoing. At step 614, a second passivation layer (PASS2) is formed on the first passivation layer (PASS1) 106 and the metal pad 110, as illustrated in FIG. 1H. In some embodiments, the second passivation layer (PASS2) 114 may be implemented as a suitable dielectric, i.e., insulative, material including, for example and without limitation, silicon dioxide (SiO$_2$) material, silicon nitride (SiN$_x$) material, or the like. The second passivation layer (PASS2) 114 may be deposited, for example and without limitation, by CVD, PVD, ALD, some other deposition process, or any suitable combination thereof.

At step 616, a photoresist 116 is patterned on the second passivation layer (PASS2) 114 as illustrated in FIG. 1I. At step 618, the second passivation layer (PASS2) 114 is etched and the photoresist 116 is removed/stripped. FIG. 2A provides an illustrative example of the semiconductor device 100 subsequent to the aforementioned etching and stripping. In accordance with some embodiments, the etching may be performed in accordance with any suitable etching process, e.g., an etching process implemented as a dry etching process, a RIE process, a wet etching process, some other etching process, or a combination of the foregoing. Operations then proceed to step 620, whereupon a first etch stop layer (ESL1) 118 is formed, e.g., deposited on the second passivation layer (PASS2) and the metal pad 110, as shown in FIG. 2B. In some embodiments, the first etch stop layer (ESL1) 118 may be implemented as a suitable barrier material configured to protect the layers and components below from damage during subsequent etching processes, including, for example and without limitation tantalum oxide (TaO), tantalum (Ta), titanium (Ti), silicon nitride (SiN), and the like.

At step 622, a third passivation layer (PI) 120 is deposited and patterned on the semiconductor device 100. In accordance with some embodiments, the third passivation layer (PI) 120 may be implemented as a polyimide material, or other suitable material having equivalent thermal stability, chemical resistance, and electrical properties. It will be appreciated that the stage of formation of the semiconductor device 100 illustrated in FIG. 2C depicts the results of the coating, patterning, developing, and curing of the third passivation layer (PI) 120. As shown in FIG. 2C, an opening 122 in the third passivation layer (PI) 120 remains after the aforementioned processing, leaving the first etch stop layer (ESL1) 118 exposed on the metal pad 110.

At step 624, a second etch stop layer (ESL2) 124 is formed, i.e., deposited on the third passivation layer (PI) 120 and the first etch stop layer (ESL1) 118 disposed on the metal pad 110, as shown in FIG. 2D. In some embodiments, the second etch stop layer (ESL2) 124 may be implemented may be implemented as tantalum oxide (TaO), tantalum (Ta), titanium (Ti), silicon nitride (SiN), and the like. It will be appreciated that the second etch stop layer (ESL2) 124 corresponds to a layer of material that has drastically different etching characteristics than the material to be etched, so as to stop or halt the etching processing of the layer deposited on the etch stop layer. In varying embodiments, the first etch stop layer (ESL1) 118 and the second etch stop layer (ESL2) 124 may be implemented as the same type of material, or may be different materials.

At step 626, a bottom metal layer/conductive film 126 is deposited on the second etch stop layer (ESL2) 124. The bottom metal film/conductive layer 126 is formed on the second etch stop layer (ESL2) 124 of a suitable metal material. In some embodiments, the bottom metal film/conductive layer 126 is formed of iron, cobalt, titanium-nitride (TiN), copper, or the like. In some embodiments, the bottom metal film/conductive layer 126 may be deposited by, for example, CVD, PVD, ALD, electroless plating, electrochemical plating, sputtering, ion metal plasma, another deposition process, or any suitable combination thereof. FIG. 2E provides an illustrative example of the semiconductor device 100 inclusive of the deposited bottom metal film/conductive layer 126.

At step 628, a photoresist 128 is deposited and patterned on the bottom metal film/conductive layer 126, as shown in FIG. 2F. At 630, a wet etching product 130 (e.g., a suitable acid or other solvent) is applied to the semiconductor device 100 to remove, i.e., etch, portions of the bottom metal film/conductive layer 126 not covered by the photoresist 128. As shown in FIG. 2G, the second etch stop layer (ESL2) 124 functions as a barrier between the wet etching product 130, the third passivation layer (PI) 120, and the metal pad 110. Accordingly, it will be appreciated that even in the event that delamination of the second etch stop layer (ESL2) 124 occurs along the third passivation layer (PI) 120 within the opening 122, the first etch stop layer (ESL1) 118 remains in place as a suitable barrier between the wet etching product 130 and the metal pad 110.

At step 632, the wet etching product 130 and any dissolved metal particles from the etched bottom metal film/conductive layer 126 are removed from the semiconductor device 100. Thereafter, at step 634, portions of the first etch stop layer (ESL1) 118 and the second etch stop layer (ESL2) 124 are removed from the semiconductor device 100, exposing the portion of the metal pad 110 within the opening 122 through the third passivation layer (PI) 120 and covering the third passivation layer (PI) 120 outside of the opening 122. FIG. 2H provides an illustration of the semiconductor device 100 after completion of the processing set forth above. It will be appreciated that removal of the first and second etch stop layers (ESL1, ESL2) 118, 124 may be implemented via any suitable etching process, e.g., an etching process implemented as a dry etching process, a RIE process, a wet etching process, some other etching process, or a combination of the foregoing.

At step 636, a fourth passivation layer 134 is coated, exposed, developed, etc., (i.e., formed) on the semiconductor device 100, thereby encapsulating or covering the bottom metal film/conductive layer 126 as shown in FIG. 3A. In some embodiments, the processing of step 636 may include patterning of a photoresist onto the semiconductor device 100 so as to protect/cover the opening 122 and portions of the third passivation layer (PI) 120. The fourth passivation layer 134 is then deposited, and the photoresist is thereafter removed, resulting in the semiconductor device 100 as illustrated in FIG. 3A. In some embodiments, the fourth passivation layer 134 may be implemented as a suitable polyimide material, or other suitable materials, including, for example and without limitation, insulative material such as silicon dioxide ($SiO_2$), silicon nitride ($SiN_x$), and the like.

At step 638, a metal post passivation interconnect (PPI) 138 is deposited and formed on the semiconductor device 100, as illustrated in FIG. 3C. In accordance with some embodiments, the fourth passivation layer 134 may be implemented as a suitable polyimide material, functioning as a polyimide fence (PMF), i.e., a polyimide layer between the bottom metal film/conductive layer 126 and the metal post passivation interconnect (PPI) 138. In some embodiments, formation of the metal post passivation interconnect (PPI) 138 at step 638 may include patterned application of a photoresist, deposition of the metal post passivation interconnect (PPI) 138 material, patterning of the material (e.g., plating, etching, etc.), stripping of the photoresist, formation of the via 139 contacting metal pad 110, etc.

At step 640, a fifth passivation layer 140 is deposited and patterned on the semiconductor device 100. The fifth passivation layer 140 may be implemented as a suitable polyimide material. Other suitable materials may be utilized for the fifth passivation layer 140, including, for example and without limitation, insulative material such as silicon dioxide ($SiO_2$), silicon nitride ($SiN_x$), and the like. It will be appreciated that deposition and patterning (i.e., forming) of the fifth passivation layer 140 may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist, with subsequent removal of the photoresist.

At step 642, a third etch stop layer (ESL3) 144 is formed, e.g., deposited, onto the semiconductor device 100. In some embodiments, the third etch stop layer (ESL3) 144 may be implemented as tantalum oxide (TaO), tantalum (Ta), titanium (Ti), silicon nitride (SiN), and the like. At step 644, a top metal film/conductive layer 146 is deposited on the third etch stop layer (ESL3) 144. In some embodiments, the top metal film/conductive layer 146 is formed of iron, cobalt, titanium-nitride (TiN), copper, alloys thereof, other conductive metals or metallic alloys, or the like. FIG. 3E provides an illustration of the semiconductor device 100 in accordance with the formation of the third etch stop layer (ESL3) 144 and the top metal film/conductive layer 146. It will be appreciated that the deposition of the third etch stop layer (ESL3) 144 and the top metal film/conductive layer 146 may be implemented by, for example, chemical vapor deposition (CVD), physical vapor deposition (PVD), atomic layer deposition (ALD), electroless plating, electrochemical plating, sputtering, ion metal plasma, another deposition process, or any suitable combination thereof.

At step 646, a photoresist is patterned on the top metal film/conductive layer 146. At step 648, etching is performed on the top metal film/conductive layer 146 to remove portions thereof not covered by the patterned photoresist. It will be appreciated that removal of the uncovered top metal film/conductive layer 146 may be implemented via any suitable etching process, e.g., an etching process implemented as a dry etching process, a RIE process, a wet etching process, some other etching process, or a combination of the foregoing. In some embodiments, a wet etching procedure is performed on the top metal film/conductive layer 146, wherein the third etch stop layer (ESL3) 144 functions as a barrier to protect the underlying fifth passivation layer 140. At step 650, the photoresist and the third etch stop layer (ESL3) 144 are removed from the semiconductor device, resulting in the intermediate stage of the semiconductor device 100 illustrated in FIG. 3F.

At step 652, a sixth passivation layer 148 is formed, e.g., deposited, on the fifth passivation layer 144 and the remaining top metal film/conductive layer 146, as illustrated in FIG. 3G. It will be appreciated that deposition and patterning of the sixth passivation layer 148 may employ any suitable patterning technique such as a photolithographic patterning technique using deposition of a photoresist layer and selective exposure via a photomask to visible light, ultraviolet light, deep ultraviolet light (i.e., DUV lithography), extreme ultraviolet light (i.e. EUV lithography), or so forth, followed by development of the exposed photoresist and subsequent etching, deposition or other process steps laterally delineated by the developed photoresist. In some embodiments, a photoresist is applied to the bottom of the bump opening 142 on the exposed metal post passivation interconnect (PPI) 138 prior to deposition of the sixth passivation layer 148. Such photoresist is then removed so as to expose the aforementioned portion of the metal post passivation interconnect (PPI) 138 within the bump opening 142. According to one embodiment, the sixth passivation layer 148 may be implemented as a suitable polyimide material, an insulative material such as silicon dioxide ($SiO_2$), silicon nitride ($SiN_x$), or the like.

At step 654, a photoresist 150 is patterned on portions of the sixth passivation layer 148, with the bump opening 142 uncovered by the protective photoresist 150. FIG. 3H provides an illustration of the semiconductor device 100 with the bump opening 142 exposed through the photoresist 150. At step 656, a bottom bump metal 154 is deposited within the bump opening 142, contacting the exposed portion of the metal post passivation interconnect (PPI) 138. In some embodiments, the bottom bump metal 154 may be implemented as Al, Cu, Fe, or other similar conductive metals or alloys thereof. At step 658, a top bump metal 156 is deposited on the bottom bump metal 154 within the bump opening 142. In some embodiments, the top bump metal 156 may be implemented as Al, Cu, Fe, similar conductive metals, or alloys thereof. In accordance with one embodiment, the bottom and top bump metals 154, 156 are comprised of different materials. The bottom bump metal 154 and/or the top bump metal 156 may be deposited via CVD, PVD, ALD, electroless plating, electrochemical plating, sputtering, ion metal plasma, another deposition process, or any suitable combination thereof. Thereafter, at step 660, the photoresist 150 is removed and the fabrication with respect to FIG. 6 is complete, as illustrated by the semiconductor device 100 of FIG. 3I.

In accordance with a first embodiment, there is provided a method of manufacturing a semiconductor device. The method includes forming, on a substrate including at least one top metal component exposed on a surface of the substrate, a first passivation layer. A portion of the at least one top metal component is exposed through the first passivation layer. The method further includes forming, on the substrate and at least a portion of the first passivation layer, a metal pad that contacts the portion of the at least one top metal component that is exposed through the first passivation layer. The method also includes forming, on the first passivation layer and at least a portion of the metal pad, a second passivation layer, and forming, on the second passivation layer and a portion of the metal pad exposed through the second passivation layer, a first etch stop layer. The method further includes forming a third passivation layer on a first portion of the first etch stop layer. The formed third passivation layer includes an opening that is located above the portion of the metal pad that is exposed through the second passivation layer. Further, the method includes forming a second etch stop layer on the third passivation layer and a second portion of the first etch stop layer located within the opening, and depositing a bottom metal film/conductive layer on the second etch stop layer. The method then includes wet etching the bottom metal film/conductive layer, removing the second etch layer and the second portion of the first etch stop layer to expose the portion of the metal pad within the opening, and forming a metal post passivation interconnect within the opening.

In accordance with a second embodiment, there is provided a semiconductor device that includes an integrated circuit substrate. The substrate includes a first passivation layer located on a surface of the substrate, with a portion of a top metal component of the substrate being exposed through the first passivation layer. The substrate further includes a metal pad positioned on the first passivation layer and interconnected with the exposed portion of the top metal component. The substrate also includes a second passivation layer on the first passivation layer and at least a portion of the metal pad, and a first etch stop layer on the second passivation layer and a portion of the metal pad exposed through the second passivation layer. The substrate of the semiconductor device includes a third passivation layer that is formed on the first etch stop layer. The third passivation layer includes an opening located above the portion of the metal pad exposed through the second passivation layer. The substrate further includes a second etch stop layer on the third passivation layer, and a bottom metal film/conductive layer disposed on the second etch stop layer.

In accordance with a third embodiment, there is provided a method of manufacturing a semiconductor device that includes forming a first passivation layer on a substrate that has at least one top metal component. The method also includes forming a metal pad on the first passivation layer that extends through the first passivation layer to contact the at least one top metal component. The method further includes forming a second passivation layer on the first passivation layer and the metal pad. A portion of the at least one top metal component is exposed through the second passivation layer. The method also includes forming a first etch stop layer on the second passivation layer and the exposed portion of the metal pad, and forming a third passivation layer on the first etch stop layer. The third passivation layer further includes an opening to the first etch stop layer disposed on the metal pad. The method also includes forming a second etch stop layer on the third passivation layer and the first etch stop layer located within the opening, and forming a bottom metal film/conductive layer on the second etch stop layer. In addition, the method includes removing portions of the bottom metal film/conductive layer, the second etch stop layer, and the first etch stop layer. Furthermore, the method includes forming a metal post passivation interconnect within the opening, wherein the portion of the metal pad is exposed therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming, on a substrate including at least one top metal component exposed on a surface of the substrate, a first passivation layer, wherein a portion of the at least one top metal component is exposed through the first passivation layer;
    forming, on the substrate and at least a portion of the first passivation layer, a metal pad, the metal pad contacting the portion of the at least one top metal component exposed through the first passivation layer;
    forming, on the first passivation layer and at least a portion of the metal pad, a second passivation layer;
    forming, on the second passivation layer and a portion of the metal pad exposed through the second passivation layer, a first etch stop layer;
    forming a third passivation layer on a first portion of the first etch stop layer, the third passivation layer having an opening located above the portion of the metal pad exposed through the second passivation layer;
    forming a second etch stop layer on the third passivation layer and a second portion of the first etch stop layer located within the opening;
    depositing a bottom metal film/conductive layer on the second etch stop layer;
    wet etching the bottom metal film/conductive layer;
    removing the second etch layer and the second portion of the first etch stop layer exposing the portion of the metal pad within the opening; and
    forming a metal post passivation interconnect within the opening.

2. The method of claim 1, further comprising forming a fourth passivation layer on the bottom metal film/conductive layer prior to forming the metal post passivation interconnect.

3. The method of claim 2, further comprising forming a fifth passivation layer on the metal post passivation interconnect, the fifth passivation layer including a bump opening therethrough to the metal post passivation interconnect.

4. The method of claim 3, further comprising forming a third etch stop layer on the fifth passivation layer and within the bump opening.

5. The method of claim 4, further comprising depositing a top metal film/conductive layer on the third etch stop layer.

6. The method of claim 5, further comprising:
    forming a pattern of photoresist on the top metal film/conductive layer;
    wet etching a portion of the top metal film/conductive layer uncovered by the photoresist; and
    removing the third etch stop layer and photoresist.

7. The method of claim 6, further comprising forming a sixth passivation layer on the fifth passivation layer and the top metal film/conductive layer.

8. The method of claim 7, further comprising forming a bump in the bump opening, wherein the bump comprises a bottom bump metal contacting the metal post passivation interconnect and a top bump metal contacting the bottom bump metal.

9. A method of manufacturing a semiconductor device, comprising:
    forming a first passivation layer on a substrate including at least one top metal component;
    forming a metal pad on the first passivation layer, the metal pad extending through the first passivation layer to contact the at least one top metal component;
    forming a second passivation layer on the first passivation layer and the metal pad, wherein a portion of the at least one top metal component is exposed through the second passivation layer;
    forming a first etch stop layer on the second passivation layer and the exposed portion of the metal pad;
    forming a third passivation layer on the first etch stop layer, wherein the third passivation layer includes an opening to the first etch stop layer disposed on the metal pad;
    forming a second etch stop layer on the third passivation layer and the first etch stop layer located within the opening;
    forming a bottom metal film/conductive layer on the second etch stop layer;
    removing portions of the bottom metal film/conductive layer, the second etch stop layer, and the first etch stop layer; and
    forming a metal post passivation interconnect within the opening, wherein the portion of the metal pad is exposed therein.

10. The method of claim 9, further comprising:
    forming a fourth passivation layer on the bottom metal film/conductive layer prior to forming the metal post passivation interconnect;
    forming a fifth passivation layer on the metal post passivation interconnect, the fifth passivation layer including a bump opening therethrough to the metal post passivation interconnect;
    forming a third etch stop layer on the fifth passivation layer and within the bump opening; and
    forming a top metal film/conductive layer on the third etch stop layer.

11. The method of claim 10, further comprising:
    forming a sixth passivation layer on the fifth passivation layer and the top metal film/conductive layer; and forming a bump in the bump opening, wherein the bump comprises a bottom bump metal contacting the metal post passivation interconnect and a top bump metal contacting the bottom bump metal.

12. The method of claim 11, wherein at least one of the first etch stop layer, the second etch stop layer, or the third etch stop layer comprises tantalum oxide (TaO), tantalum (Ta), titanium (Ti), or silicon nitride (SiN).

13. The method of claim 11, wherein the third passivation layer comprises polyimide.

14. A method of manufacturing a semiconductor device, comprising:
   forming, on a substrate including at least one top metal component exposed on a surface of the substrate, a first passivation layer, wherein a portion of the at least one top metal component is exposed through the first passivation layer;
   forming, on the substrate and at least a portion of the first passivation layer, a metal pad, the metal pad contacting the portion of the at least one top metal component exposed through the first passivation layer;
   forming, on the first passivation layer and at least a portion of the metal pad, a second passivation layer;
   forming, on the second passivation layer and a portion of the metal pad exposed through the second passivation layer, a first etch stop layer;
   forming a third passivation layer on a first portion of the first etch stop layer, the third passivation layer having an opening located above the portion of the metal pad exposed through the second passivation layer;
   forming a second etch stop layer on the third passivation layer and a second portion of the first etch stop layer located within the opening; and
   depositing a bottom metal film/conductive layer on the second etch stop layer.

15. The method of claim 14, further comprising:
   forming a fourth passivation layer on the bottom metal film/conductive layer and at least a portion of the third passivation layer; and
   disposing a metal post passivation interconnect over the fourth passivation layer, the metal post passivation interconnect including a via passing through the third passivation layer and contacting the metal pad.

16. The method of claim 15, further comprising:
   forming a fifth passivation layer over the metal post passivation interconnect;
   forming a third etch stop layer on the fifth passivation layer;
   depositing a top metal film/conductive layer on the third etch stop layer; and
   depositing a sixth passivation layer on the top metal film/conductive layer and the fifth passivation layer.

17. The method of claim 16, further comprising:
   forming a bump opening through the sixth passivation layer and the fifth passivation layer to the metal post passivation interconnect; and
   forming a bump positioned within the bump opening and contacting the metal post passivation interconnect.

18. The method of claim 14, wherein the first etch stop layer comprises tantalum oxide (TaO), tantalum (Ta), titanium (Ti), or silicon nitride (SiN).

19. The method of claim 14, wherein the third passivation layer comprises polyimide.

20. The method of claim 14, wherein the metal pad and the bottom metal film/conductive layer comprise different materials.

* * * * *